(12) United States Patent
Nonaka et al.

(10) Patent No.: US 11,462,701 B2
(45) Date of Patent: Oct. 4, 2022

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Yusuke Nonaka, Kanagawa (JP); Satoshi Seo, Kanagawa (JP); Harue Osaka, Kanagawa (JP); Tsunenori Suzuki, Kanagawa (JP); Takeyoshi Watabe, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/173,541

(22) Filed: Oct. 29, 2018

(65) Prior Publication Data

US 2019/0067614 A1 Feb. 28, 2019

Related U.S. Application Data

(63) Continuation of application No. 15/258,622, filed on Sep. 7, 2016, now Pat. No. 10,128,455, which is a
(Continued)

(30) Foreign Application Priority Data

May 16, 2013 (JP) .................................. 2013-104016
Oct. 23, 2013 (JP) .................................. 2013-220059

(51) Int. Cl.
*H01L 51/50* (2006.01)
*H01L 51/52* (2006.01)
*H01L 51/00* (2006.01)

(52) U.S. Cl.
CPC ...... *H01L 51/5012* (2013.01); *H01L 51/5004* (2013.01); *H01L 51/5016* (2013.01);
(Continued)

(58) Field of Classification Search
CPC ............ H01L 51/5012; H01L 51/5016; H01L 51/5004; H01L 51/5278; H01L 51/5056; H01L 2251/552
See application file for complete search history.

(56) References Cited

U.S. PATENT DOCUMENTS 7,175,922 B2   2/2007   Jarikov et al.
7,183,010 B2   2/2007   Jarikov
(Continued)

FOREIGN PATENT DOCUMENTS

CN   102428588 A   4/2012
CN   102428589 A   4/2012
(Continued)

OTHER PUBLICATIONS

International Search Report re Application No. PCT/JP2014/062763, dated Jun. 24, 2014.
(Continued)

*Primary Examiner* — Aaron J Gray
(74) *Attorney, Agent, or Firm* — Husch Blackwell LLP

(57) ABSTRACT

To increase emission efficiency of a fluorescent light-emitting element by efficiently utilizing a triplet exciton generated in a light-emitting layer. The light-emitting layer of the light-emitting element includes at least a host material and a guest material. The triplet exciton generated from the host material in the light-emitting layer is changed to a singlet exciton by triplet-triplet annihilation (TTA). The guest material (fluorescent dopant) is made to emit light by energy transfer from the singlet exciton. Thus, the emission efficiency of the light-emitting element is improved.

15 Claims, 13 Drawing Sheets

Related U.S. Application Data continuation of application No. 14/276,621, filed on May 13, 2014, now Pat. No. 9,444,063.

(52) U.S. Cl.
CPC ...... *H01L 51/5056* (2013.01); *H01L 51/5278* (2013.01); *H01L 51/006* (2013.01); *H01L 51/0052* (2013.01); *H01L 51/0054* (2013.01); *H01L 51/0058* (2013.01); *H01L 51/0067* (2013.01); *H01L 51/0085* (2013.01); *H01L 2251/552* (2013.01)

(56) References Cited

U.S. PATENT DOCUMENTS

| | | |
|---|---|---|
| 7,332,857 B2 | 2/2008 | Seo et al. |
| 7,597,967 B2 | 10/2009 | Kondakova et al. |
| 7,875,879 B2 | 1/2011 | Suzuki et al. |
| 7,993,760 B2 | 8/2011 | Komori et al. |
| 8,034,465 B2 | 10/2011 | Liao et al. |
| 8,274,214 B2 | 9/2012 | Ikeda et al. |
| 8,324,615 B2 | 12/2012 | Seo et al. |
| 8,362,472 B2 | 1/2013 | Suzuki et al. |
| 8,421,346 B2 | 4/2013 | Osaka et al. |
| 8,461,574 B2 | 6/2013 | Nishimura et al. |
| 8,476,823 B2 | 7/2013 | Kuma et al. |
| 8,642,190 B2 | 2/2014 | Ogita et al. |
| 8,723,171 B2 | 5/2014 | Nishimura et al. |
| 8,853,680 B2 | 10/2014 | Yamazaki et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,126,943 B2 | 9/2015 | Kawamura et al. |
| 9,142,782 B2 | 9/2015 | Pillow et al. |
| 9,147,854 B2 | 9/2015 | Seo et al. |
| 9,153,790 B2 | 10/2015 | Kuma et al. |
| 9,159,942 B2 | 10/2015 | Seo et al. |
| 9,175,132 B2 | 11/2015 | Meyer et al. |
| 9,175,213 B2 | 11/2015 | Seo et al. |
| 9,273,002 B2 | 3/2016 | Ito et al. |
| 9,356,250 B2 | 5/2016 | Ohsawa et al. |
| 9,444,063 B2 | 9/2016 | Nonaka et al. |
| 9,484,540 B2 | 11/2016 | Ito et al. |
| 9,553,273 B2 | 1/2017 | Ogita et al. |
| 9,604,928 B2 | 3/2017 | Shitagaki et al. |
| 9,773,981 B2 | 9/2017 | King et al. |
| 9,812,647 B2 | 11/2017 | Pillow et al. |
| 9,812,661 B2 | 11/2017 | Kuma et al. |
| 10,050,207 B2 | 8/2018 | Ogita et al. |
| 2003/0175553 A1 | 9/2003 | Thompson et al. |
| 2005/0048310 A1 | 3/2005 | Cocchi et al. |
| 2005/0221116 A1 | 10/2005 | Cocchi et al. |
| 2006/0134464 A1 | 6/2006 | Nariyuki |
| 2007/0090756 A1 | 4/2007 | Okada et al. |
| 2007/0224447 A1 | 9/2007 | Sotoyama et al. |
| 2010/0084647 A1 | 4/2010 | Kondakova et al. |
| 2010/0133522 A1* | 6/2010 | Pieh .................... H01L 27/3209 257/89 |
| 2010/0295444 A1 | 11/2010 | Kuma et al. |
| 2010/0295445 A1 | 11/2010 | Kuma et al. |
| 2010/0301318 A1 | 12/2010 | Kuma et al. |
| 2010/0301319 A1 | 12/2010 | Kuma et al. |
| 2010/0314644 A1 | 12/2010 | Nishimura et al. |
| 2011/0057178 A1* | 3/2011 | Shitagaki ............ H01L 51/5012 257/E51.026 |
| 2011/0215714 A1* | 9/2011 | Seo .................... H01L 51/5278 313/504 |
| 2011/0233604 A1 | 9/2011 | Ikeda |
| 2012/0061651 A1* | 3/2012 | Osaka .................. C07D 409/10 257/E51.026 |
| 2012/0077987 A1* | 3/2012 | Osaka .................. H01L 51/0054 570/183 |
| 2012/0126205 A1 | 5/2012 | Kawamura et al. |
| 2012/0126208 A1 | 5/2012 | Kawamura et al. |
| 2012/0126209 A1* | 5/2012 | Kawamura ......... H01L 51/5096 257/E51.026 |
| 2012/0126222 A1 | 5/2012 | Ogiwara et al. |
| 2012/0132899 A1 | 5/2012 | Kawamura et al. |
| 2012/0153268 A1 | 6/2012 | Kawamura et al. |
| 2012/0211743 A1 | 8/2012 | Ito et al. |
| 2012/0217487 A1 | 8/2012 | Yamazaki et al. |
| 2012/0248968 A1* | 10/2012 | Ogiwara ............. H01L 51/0059 313/504 |
| 2013/0187145 A1 | 7/2013 | Pegington et al. |
| 2013/0306957 A1 | 11/2013 | Mizuki et al. |
| 2013/0306958 A1 | 11/2013 | Ito et al. |
| 2015/0069352 A1 | 3/2015 | Kim et al. |

FOREIGN PATENT DOCUMENTS

| | | |
|---|---|---|
| CN | 102473857 A | 5/2012 |
| CN | 102668159 A | 9/2012 |
| CN | 102668160 A | 9/2012 |
| CN | 102832349 A | 12/2012 |
| EP | 1 202 608 A2 | 5/2002 |
| EP | 2 314 565 A1 | 4/2011 |
| EP | 2 434 558 A1 | 3/2012 |
| EP | 2 434 559 A1 | 3/2012 |
| EP | 2 442 379 A1 | 4/2012 |
| EP | 2 524 913 A1 | 11/2012 |
| EP | 2 525 425 A1 | 11/2012 |
| EP | 2 573 075 A1 | 3/2013 |
| EP | 2 626 346 A1 | 8/2013 |
| EP | 2 644 607 A1 | 10/2013 |
| EP | 2 645 443 A1 | 10/2013 |
| EP | 3 104 428 A1 | 12/2016 |
| EP | 3 192 789 A1 | 7/2017 |
| GB | 2 483 629 A | 3/2012 |
| JP | 2008-288344 A | 11/2008 |
| JP | 2011-204801 A | 10/2011 |
| JP | 2012-169613 A | 9/2012 |
| JP | 2012-530820 | 12/2012 |
| JP | 2013-063983 A | 4/2013 |
| JP | 5238889 B2 | 7/2013 |
| JP | 2013-543250 | 11/2013 |
| JP | 2014-503979 | 2/2014 |
| KR | 2010-0003624 A | 1/2010 |
| KR | 2012-0024624 A | 3/2012 |
| KR | 2012-0092550 A | 8/2012 |
| KR | 2012-0092555 A | 8/2012 |
| KR | 2012-0100709 A | 9/2012 |
| TW | 201144406 | 12/2011 |
| TW | 201232864 | 8/2012 |
| TW | 201301598 | 1/2013 |
| TW | 201315797 | 4/2013 |
| WO | WO 2005/105746 A1 | 11/2005 |
| WO | WO 2008/102713 A1 | 8/2008 |
| WO | WO 2010/134350 A1 | 11/2010 |
| WO | WO 2010/134352 A1 | 11/2010 |
| WO | WO 2010/143434 A1 | 12/2010 |
| WO | WO 2011/086935 A1 | 7/2011 |
| WO | WO 2011/086941 A1 | 7/2011 |
| WO | WO 2011/161416 A2 | 12/2011 |
| WO | WO 2011/161417 A1 | 12/2011 |
| WO | WO 2011/161424 A1 | 12/2011 |
| WO | WO 2011/161425 A1 | 12/2011 |
| WO | WO 2012/008331 A1 | 1/2012 |
| WO | WO 2012/046839 A1 | 4/2012 |
| WO | WO 2012/070226 A1 | 5/2012 |
| WO | WO 2012/070227 A1 | 5/2012 |
| WO | WO 2012/070233 A1 | 5/2012 |
| WO | WO 2012/070234 A1 | 5/2012 |

OTHER PUBLICATIONS

Written Opinion re Application No. PCT/JP2014/062763, dated Jun. 24, 2014.
Anryu, M. et al., "Analysis of TTA Process of High-molecular Luminescent Material and Increase in EL Efficiency," Proceedings of 15th regular meeting of organic EL discussion session, Nov. 21, 2012, pp. 37-38.

(56) References Cited

OTHER PUBLICATIONS

Yersin, H. et al., Highly Efficient OLEDs with Phosphorescent Materials, 2008, pp. 1-97,283-309, Wiley-VCH Verlag GmbH & Co..

Tokito,S. et al., "Improvement in Performance by Doping," Organic EL Display, Aug. 20, 2004, pp. 67-99, Ohmsha.

Jeon, W.S. et al., "Ideal Host and Guest System in Phosphorescent OLEDs," Organic Electronics, 2009, vol. 10, pp. 240-246, Elsevier.

Su, S-J et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.

Rausch, A.F. et al., "Matrix Effects on the Triplet State of the OLED Emitter Ir(4,6-dFppy)2(pic)(FIrpic):Investigations by High-Resolution Optical Spectroscopy," Inorganic Chemistry, 2009, vol. 48, No. 5, pp. 1928-1937.

Gong, X. et al., "Phosphorescence from Iridium Complexes Doped into Polymer Blends," Journal of Applied Physics, Feb. 1, 2004, vol. 95, No. 3, pp. 948-953.

Zhao, Q. et al., "Synthesis and Photophysical, Electrochemical, and Electrophosphorescent Properties of a Series of Iridium(III) Complexes Based on Quinoline Derivatives and Different β-Diketonate Ligands," Organometallics, Jun. 14, 2006, vol. 25, No. 15, pp. 3631-3638.

Hino, Y. et al., "Red Phosphorescent Organic Light-Emitting Diodes Using Mixture System of Small-Molecule and Polymer Host," Japanese Journal of Applied Physics, Apr. 21, 2005, vol. 44, No. 4B, pp. 2790-2794.

Tsuboyama, A. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.

Kondakova, M.E. et al., "High-Efficiency, Low-Voltage Phosphorescent Organic Light-Emitting Diode Devices with Mixed Host," Journal of Applied Physics, Nov. 4, 2008, vol. 104, pp. 094501-1-094501-17.

Chen, F-C. et al., "Triplet Exciton Confinement in Phosphorescent Polymer Light-Emitting Diodes," Applied Physics Letters, Feb. 17, 2003, vol. 82, No. 7, pp. 1006-1008.

Lee, J.Y. et al., "Stabilizing the Efficiency of Phosphorescent Organic Light-Emitting Diodes," SPIE Newsroom, Apr. 21, 2008, pp. 1-3.

Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.

Endo, A. et al., "Efficient Up-Conversion of Triplet Excitons Into a Singlet State and Its Application for Organic Light Emitting Diodes," Applied Physics Letters, Feb. 24, 2011, vol. 98, No. 8, pp. 083302-1-083302-3.

Itano, K. et al., "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, Feb. 9, 1998, vol. 72, No. 6, pp. 636-638.

Park, Y-S. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.

Taiwanese Office Action re Application No. TW 103117010, dated May 14, 2018.

Taiwanese Office Action (Application No. 110121576) dated May 13, 2022.

* cited by examiner

LIGHT-EMITTING ELEMENT, LIGHT-EMITTING DEVICE, ELECTRONIC DEVICE, AND LIGHTING DEVICE

This application is a continuation of copending U.S. application Ser. No. 15/258,622, filed on Sep. 7, 2016 which is a continuation of U.S. application Ser. No. 14/276,621, filed on May 13, 2014 (now U.S. Pat. No. 9,444,063 issued Sep. 13, 2016) which are all incorporated herein by reference.

TECHNICAL FIELD

One embodiment of the present invention relates to a light-emitting element, and a light-emitting device, an electronic device, and a lighting device each including a light-emitting element.

BACKGROUND ART

A light-emitting element having a structure in which a light-emitting layer including an organic compound that is a light-emitting substance is provided between a pair of electrodes has attracted attention as a next-generation flat panel display element in terms of characteristics such as being thin and light in weight, high speed response, and direct current low voltage driving. Furthermore, a display device including this light-emitting element is superior in contrast, image quality, and has wide viewing angle.

A light-emitting element is said to have a light-emitting mechanism in which an electron and a hole are injected by application of voltage between a pair of electrodes and recombined to form an exciton, so that light is emitted. Electrons and holes each have a spin of ½. It is said that the recombination of electrons and holes allows generation of excitons including 25% spin-0 singlet excitons and 75% spin-1 triplet excitons on the basis of the spin statistics. Note that fluorescence is emitted from a singlet exciton; hence, the theoretical limit of internal quantum efficiency of fluorescence is 25%. The spin-1 triplet excitons constituting 75% of generated excitons relax to the ground state without emitting light in many cases, because they generally do not contribute to light emission. In some cases, triplet-triplet annihilation (TTA) due to a plurality of triplet excitons occurs. TTA is said to be a process in which, by collision between two triplet excitons, energy and a spin angular momentum are exchanged and delivered, generating a singlet exciton.

Development of a phosphorescent light-emitting element having internal quantum efficiency higher than a theoretical value is proposed as well as development of a phosphorescent compound (for example, see Patent Document 1) in order to efficiently use a triplet exciton generated in the light-emitting mechanism. Specifically, a compound with which triplet excitation energy can be converted to light emission (hereinafter referred to as phosphorescent compound) is used in addition to the above-described light-emitting substance, thereby providing phosphorescence due to transfer of energy between states with different multiplicities.

REFERENCE

Patent Document

[Patent Document 1] PCT International Publication No. WO 2005/105746

DISCLOSURE OF INVENTION

In one embodiment of the present invention, emission efficiency of a fluorescent light-emitting element is increased by using efficiently a triplet exciton generated in a light-emitting layer.

In one embodiment of the present invention, emission efficiency of a light-emitting element is improved in the following manner. By making triplet-triplet annihilation (TTA) occur efficiently in a light-emitting layer containing at least a host material and a guest material in the light-emitting element, a triplet exciton which does not contribute to light emission is changed to a singlet exciton; thus, the guest material (fluorescent dopant) is emitted by transfer of energy from the singlet exciton. Note that emission efficiency due to TTA is estimated to increase by approximately 15% from consideration based on the spin statistics. When the increase in emission efficiency is added to the internal quantum efficiency of 25% without TTA, an internal quantum efficiency of 40% can be achieved theoretically.

In order to increase the efficiency of occurrence of TTA due to the triplet exciton generated from the host material, it is important to increase the probability of collision of triplet excitons in the light-emitting layer.

To achieve this, a T1 level (lowest triplet exciton energy level) of the host material in the light-emitting layer is preferably lower than a T1 level of the guest material in the light-emitting layer. Generally, the proportion of a host material in a light-emitting layer is much higher than the proportion of a guest material in the light-emitting layer. When triplet excitons generated in the light-emitting layer are trapped by the guest material existing in only small amounts in the light-emitting layer, the triplet excitons are localized, leading to a reduction in the probability of collision of the triplet excitons. However, in the case of forming the light-emitting element so that the T1 level of the host material is lower than the T1 level of the guest material, a reduction in the probability of the collision of triplet excitons can be prevented, and accordingly, the probability of occurrence of TTA can be increased.

A hole-transport layer (HTL) formed on the anode side of the light-emitting element to be in contact with the light-emitting layer is preferably formed using a material having a T1 level higher than a T1 level of the host material of the light-emitting layer to prevent a triplet exciton generated in the light-emitting layer from exiting the light-emitting layer. With such a structure, a triplet exciton generated in the light-emitting layer is not likely to move from the light-emitting layer to the HTL.

Note that light emission provided when TTA occurs has an extremely longer lifetime (delayed fluorescence) than the fluorescence lifetime of a fluorescent material which is obtained in the case where TTA does not occur. The delayed fluorescence can be confirmed by observing the attenuation of light emission after steady injection of carriers is stopped at a certain point of time. Note that the delayed florescence refers to light which is continuously emitted for $1\times10^{-6}$ sec or longer after steady injection of carriers is stopped, with an intensity ratio of 0.01 or higher with respect to emission intensity during steadily injecting carriers. Note that in this case, a shape of a spectrum of delayed fluorescence coincides with a shape of an emission spectrum during steadily injecting carriers.

Thus, in a light-emitting element which is one embodiment of the present invention, an EL layer is provided between a pair of electrodes, the EL layer includes at least a light-emitting layer and a hole-transport layer, the light-emitting layer includes a guest material and a host material, a T1 level of the host material is lower than a T1 level of the guest material, the hole-transport layer includes a hole-transport material, and a T1 level of the hole-transport material is higher than the T1 level of the host material.

In a light-emitting element which is another embodiment of the present invention, an EL layer is provided between a pair of electrodes, the EL layer includes at least a light-emitting layer and a hole-transport layer, the light-emitting layer includes a guest material and a host material, a T1 level of the host material is lower than a T1 level of the guest material, the hole-transport layer includes a hole-transport material, and a T1 level of the hole-transport material is higher than the T1 level of the guest material and the T1 level of the host material.

In a light-emitting element which is another embodiment of the present invention, an EL layer is provided between a pair of electrodes, the EL layer includes at least a light-emitting layer and a hole-transport layer, the light-emitting layer includes a guest material and a host material, a T1 level of the host material is lower than a T1 level of the guest material, the hole-transport layer includes a hole-transport material, a T1 level of the hole-transport material is higher than the T1 level of the host material, a shape of a spectrum of delayed fluorescence due to TTA is the same as a shape of a fluorescent spectrum of the guest material, and a period where a ratio of an intensity of the delayed fluorescence with respect to an emission intensity during steadily injecting carriers is higher than or equal to 0.01 is $1 \times 10^{-6}$ sec or longer.

In a light-emitting element of another embodiment of the present invention, an EL layer is provided between a pair of electrodes, the EL layer includes at least a light-emitting layer and a hole-transport layer, the light-emitting layer includes a guest material and a host material, a T1 level of the host material is lower than a T1 level of the guest material, the hole-transport layer includes a hole-transport material, a T1 level of the hole-transport material is higher than the T1 level of the guest material and the T1 level of the host material, a shape of a spectrum of delayed fluorescence due to TTA is the same as a shape of a fluorescent spectrum of the guest material, and a period where a ratio of an intensity of the delayed fluorescence with respect to an emission intensity during steadily injecting carriers is higher than or equal to 0.01 is $1 \times 10^{-6}$ sec or longer.

Note that one embodiment of the present invention includes, in its scope, electronic devices and lighting devices including light-emitting devices, as well as light-emitting devices including light-emitting elements. The light-emitting device in this specification refers to an image display device and a light source (e.g., a lighting device). In addition, the light-emitting device includes all the following modules: a module in which a connector, such as a flexible printed circuit (FPC) or a tape carrier package (TCP), is attached to a light-emitting device; a module in which a printed wiring board is provided at the end of a TCP; and a module in which an integrated circuit (IC) is directly mounted on a light-emitting element by a chip-on-glass (COG) method.

In one embodiment of the present invention, a fluorescent light-emitting element with high efficiency can be provided. Furthermore, a light-emitting device, an electronic device, or a lighting device which consumes low power can be provided.

BEST MODE FOR CARRYING OUT THE INVENTION

Embodiments of the present invention will be described below with reference to drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Embodiment 1

In this embodiment, a mechanism of a light-emitting element of one embodiment of the present invention is described.

A light-emitting element of one embodiment of the present invention includes at least a light-emitting layer between a pair of electrodes (an anode and a cathode). The light-emitting element further includes a hole-transport layer in contact with the light-emitting layer between the light-emitting layer and the anode. The light-emitting layer contains a host material and a guest material.

Figure 1:
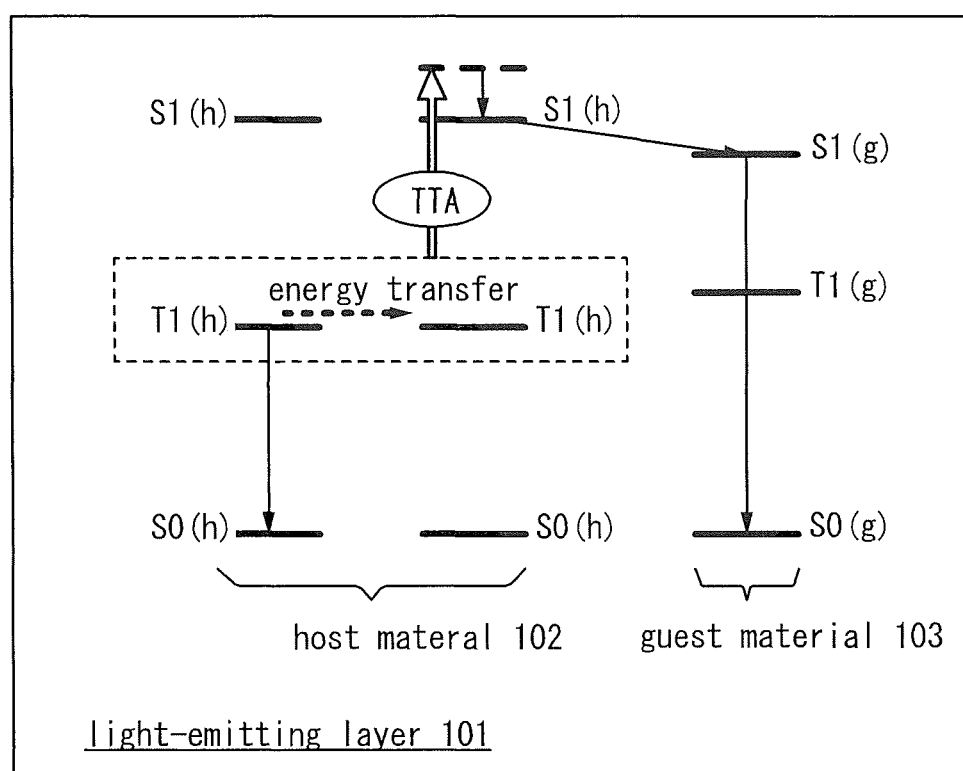
FIG. 1 illustrates a mechanism of light emission using TTA.

In the light-emitting element, when holes and electrons are injected from the anode and the cathode, respectively, singlet excitons and triplet excitons are generated in the light-emitting layer. The ratio of the singlet excitons to the triplet excitons is 1:3. The triplet excitons are usually concentrated on a host material 102 existing in large amounts in the light-emitting layer without being trapped by a guest material 103 existing in very small amounts (approximately 5 wt %) as compared to the host material 102. This is because the light-emitting element of one embodiment of the present invention is designed so that, as shown in FIG. 1, a T1 level (T1(h)) of each host material 102 contained in the light-emitting layer 101 is lower than a T1 level (T1(g)) of each guest material 103 in terms of energy. From this, it is important to satisfy a relation T1(h)<T1(g) to increase the probability of occurrence of triplet-triplet annihilation (TTA) which is to be described later.

A singlet exciton emits fluorescence, while a triplet exciton is generally annihilated without contributing to light emission. However, when a phenomenon known as TTA occurs as shown in FIG. 1, singlet excitons can be further generated, contributing to light emission. In TTA, two triplet excitons collide with each other, and energy and a spin angular momentum are exchanged and delivered.

The singlet exciton which is generated by TTA is located at an S1 level (S1(h)) of the host material when the above relation T1(h)<T1(g) is satisfied as described above. The S1 level of the host material is set to be higher than an S1 level of the guest. Therefore, energy of the singlet exciton is transferred from the S1 of the host to the S1 of the guest, unlike in the energy transfer of the triplet exciton. In this manner, fluorescence from the guest material can be obtained.

The structure shown in FIG. 1 can provide fluorescence from the guest material using the singlet exciton and fluorescence from the guest material due to TTA using the triplet exciton. Thus, with the use of the structure, a fluorescent light-emitting element with very high efficiency can be formed.

Figure 2:
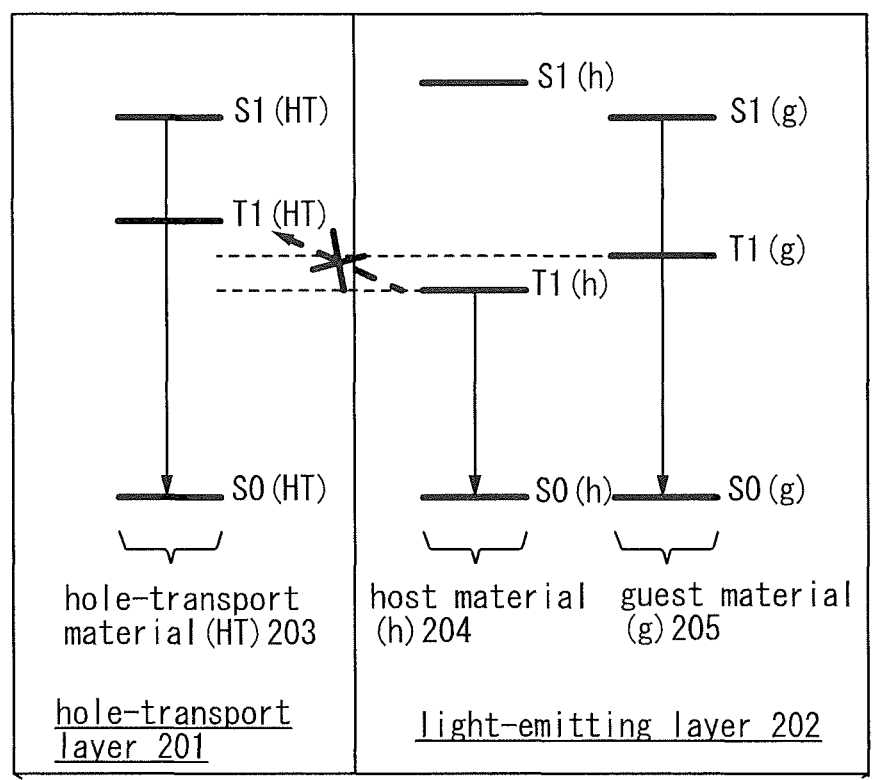
FIG. 2 illustrates a structure of a light-emitting element of one embodiment of the present invention.

Furthermore, the light-emitting element of one embodiment of the present invention has a structure shown in FIG. 2 so that the triplet exciton generated in the light-emitting layer is prevented from being released to the outside of the light-emitting layer.

That is, as shown in FIG. 2, in a hole-transport layer 201 and a light-emitting layer 202 which are formed between a first electrode (anode) 211 and a second electrode (cathode) 212, a T1 level of a hole-transport material (HT) 203 contained in the hole-transport layer 201 is set to be higher than a T1 level of a host material (h) 204 contained in the light-emitting layer 202. Thus, transfer of a triplet exciton from the T1(h) to the T1(HT) can be inhibited, so that a triplet exciton generated in the light-emitting layer 202 can be kept in the light-emitting layer 202. It is preferable that the T1 level of the hole-transport material (HT) 203 be set to be higher than a T1 level of a guest material (g) 205 contained in the light-emitting layer 202, in which case transfer of a triplet exciton from the T1(g) to the T1(HT) can also be inhibited. The hole-transport layer 201 having such a high T1 level is particularly preferable in the case where a recombination region is on the anode side of the light-emitting layer 202.

For the same reason, a layer in contact with the light-emitting layer 202 and on the cathode side of the light-emitting element (e.g., electron-transport layer (ETL)) is preferably formed using a material having a T1 level higher than that of the host material and the guest material of the light-emitting layer 202, because the triplet exciton generated in the light-emitting layer 202 can be kept in the light-emitting layer. The electron-transport layer having such a high T1 level is particularly preferable in the case where the recombination region is on the cathode side of the light-emitting layer 202.

Note that in FIG. 2, a hole-injection layer 213 having a function of enhancing injection of holes from the first electrode 211 may be provided between the first electrode (anode) 211 and the hole-transport layer 201. An electron-injection layer 215 which enhances injection of electrons from the second electrode (cathode) 212 and an electron-transport layer 214 having a high electron-transport property may be provided between the second electrode (cathode) 212 and the light-emitting layer 202.

As described above, with the use of the light-emitting element of one embodiment of the present invention, a light-emitting element, a light-emitting device, an electronic device, or a lighting device with high emission efficiency can be obtained. Furthermore, a light-emitting element, a light-emitting device, an electronic device, or a lighting device having low power consumption can be obtained.

The structure described in this embodiment can be used in appropriate combination with the structure described in any of the other embodiments.

Embodiment 2

In this embodiment, a light-emitting element of one embodiment of the present invention is described with reference to FIGS. 3A and 3B.

Figure 3A:
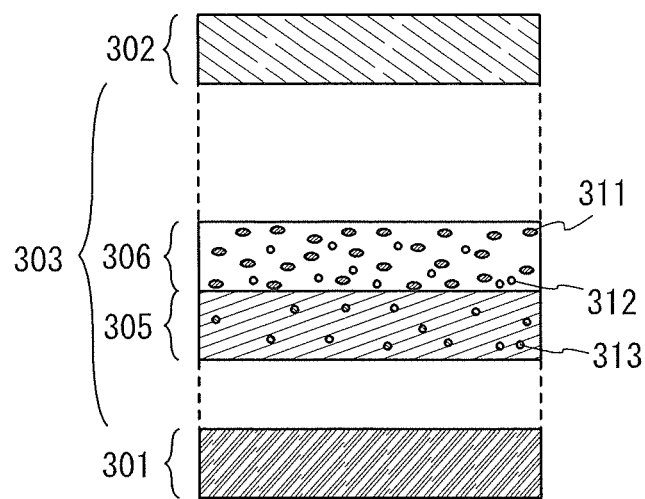
FIGS. 3A and 3B illustrate a structure of a light-emitting element.
Figure 3B:
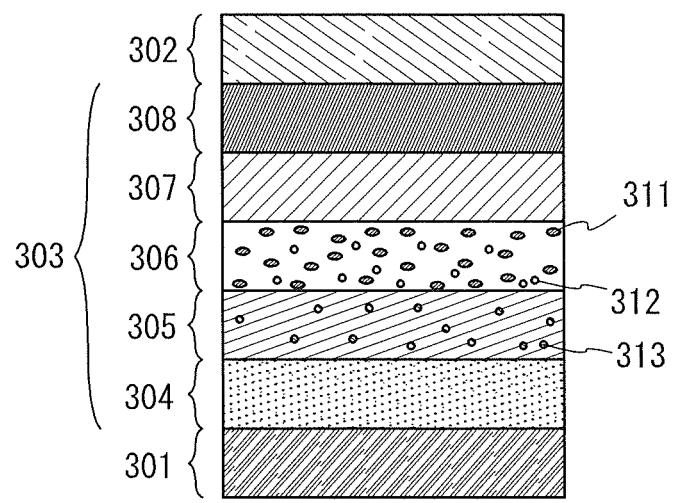

As shown in FIG. 3A, a light-emitting element in this embodiment has a structure in which an EL layer 303 including a light-emitting layer 306 and a hole-transport layer 305 between a pair of electrodes, i.e., between a first electrode (anode) 301 and a second electrode (cathode) 302. A host material 311 and a guest material 312 are included in the light-emitting layer 306. A hole-transport material 313 is included in the hole-transport layer 305. The EL layer 303 includes a hole-injection layer 304, an electron-transport layer 307, and an electron-injection layer 308, for example, in addition to the light-emitting layer 306 and the hole-transport layer 305, as shown in FIG. 3B.

By application of a voltage to such a light-emitting element, holes injected from the first electrode 301 side and electrons injected from the second electrode 302 side are recombined in the light-emitting layer 306 to form an exciton. Through conversion from the triplet exciton to the singlet exciton due to TTA and transfer of energy from the exciton, the guest material 312 contained in the light-emitting layer 306 emits light.

The hole-injection layer 304 included in the EL layer 303 contains a substance having a high hole-transport property and an acceptor substance. When electrons are extracted from the substance having a high hole-transport property owing to the acceptor substance, holes are generated. Thus, holes are injected from the hole-injection layer 304 into the light-emitting layer 306 through the hole-transport layer 305.

In the layer containing a substance having a high hole-transport property and an acceptor substance, electrons are extracted from the substance having a high hole-transport property owing to the acceptor substance in the layer. Therefore, the layer can be regarded as a layer where electrons are generated through the extraction. That is, by providing the layer on the cathode side, electrons can be injected to the light-emitting layer 306 through the electron-transport layer 307. The layer having a function of generating electric charge such as holes and electrons in this manner is what is called a charge generation layer and can be provided in the light-emitting element of one embodiment of the present invention as appropriate, as a functional layer of the light-emitting element.

A specific example in which the light-emitting element described in this embodiment is manufactured will be described.

As the first electrode (anode) 301 and the second electrode (cathode) 302, a metal, an alloy, an electrically conductive compound, a mixture thereof, and the like can be used. Specifically, indium oxide-tin oxide (indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. Note that the first electrode (anode) 301 and the second electrode (cathode) 302 can be formed by, for example, a sputtering method, an evaporation method (including a vacuum evaporation method), or the like.

Examples of the substance having a high hole-transport property and used for the hole-injection layer 304 and the hole-transport layer 305 (including the above-described charge generation layer) include 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), 3,3'-bis(9-phenyl-9H-carbazole) (abbreviation: PCCP), N-[4-(9H-carbazol-9-yl)phenyl]-N-(4-phenyl)phenylaniline (abbreviation: YGA1BP), 1,3,5-tri(dibenzothiophen-4-yl)-benzene (abbreviation: DBT3P-II), 4,4',4"-(benzene-1,3,5-triyl)tri(dibenzofuran) (abbreviation: DBF3P-II), 4-phenyl-4'-(9-phenylfluoren-9-yl)triphenylamine (abbreviation: BPAFLP), 4-[3-(triphenylen-2-yl)phenyl]dibenzothiophene (abbreviation: mDBTPTp-II), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N'-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 3-[N-(9-phenylcarbazol-3-yl)-N-phenylamino]-9-phenylcarbazole (abbreviation: PCzPCA 1, 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1). Other examples include carbazole compounds such as 4,4'-di(N-carbazolyl)biphenyl (abbreviation: CBP) and 1,3,5-tris[4-(N-carbazolyl)phenyl]benzene (abbreviation: TCPB); amine compounds; dibenzothiophene compounds; dibenzofuran compounds; fluorene compounds, triphenylene compounds; and phenanthrene compounds. The substances described here are mainly substances having a hole mobility of $1 \times 10^{-6}$ cm$^2$/Vs or higher. However, besides the above substances, others may be used as long as the material has a higher hole-transport property than an electron-transport property. Note that a material of the hole-transport layer in the light-emitting element which is one embodiment of the present invention is preferably selected from these materials so that the above-described relation of the T1 levels regarding energy is satisfied between the hole-transport layer 305, the host material of the light-emitting layer 306, and the guest material of the light-emitting layer 306.

Furthermore, a high molecular compound such as poly (N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can be used.

As examples of the acceptor substance that is used for the hole-injection layer 304 (including the above-described charge generation layer), a transition metal oxide and an oxide of a metal belonging to any of Groups 4 to 8 of the periodic table can be given. Specifically, molybdenum oxide is particularly preferable.

The light-emitting layer 306 includes the host material and the guest material as described in Embodiment 1. The T1 level of the host material is lower than the T1 level of the guest material.

Preferable examples of the host material include 3-[4-(1-naphthyl)-phenyl]-9-phenyl-9H-carbazole (abbreviation: PCPN), and anthracene compounds such as 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). The anthracene compound is preferable because of its high S1 level and low T1 level.

Preferable examples of the guest material include pyrene compounds such as N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9-phenyl-9H-fluoren-9-yl)phenyl]-N,N'-diphenylpyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), and N,N'-bis(dibenzothiophen-2-yl)-N,N'-diphenylpyrene-1,6-diamine (abbreviation: 1,6ThAPrn); anthracene compounds; triphenylene compounds; fluorene compounds; carbazole compounds: dibenzothiophene compounds; dibenzofuran compounds; dibenzoquinoxaline compounds; quinoxaline compounds; pyridine compounds; pyrimidine compounds; phenanthrene compounds; and naphthalene compounds. In particular, the pyrene compound is preferable because of its high luminescence quantum yield. Note that a material of the light-emitting layer of the light-emitting element of one embodiment of the present invention is preferably selected from these materials so that the host material and the guest material satisfy the above-described relation regarding energy of the T1 level.

The electron-transport layer 307 is a layer containing a substance having a high electron-transport property. For the electron-transport layer 307, a metal complex such as Alq$_3$, tris(4-methyl-8-quinolinolato)aluminum(III) (abbreviation: Almq$_3$), bis(10-hydroxybenzo[h]quinolinato)beryllium(II) (abbreviation: BeBq$_2$), BAlq, Zn(BOX)$_2$, or bis[2-(2-hydroxyphenyl)benzothiazolato]zinc(II) (abbreviation: Zn(BTZ)$_2$) can be used. Other examples thereof include heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs). Alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy). The substances mentioned here are mainly substances each having an electron mobility of $1 \times 10^{-6}$ cm$^2$/Vs or higher. Note that other than these substances, any substance that has an electron-transport property higher than a hole-transport property may be used for the electron-transport layer 307. Note that a material of the electron-transport layer of the light-emitting element which is one embodiment of the present invention is preferably selected from these materials so that the electron-transport layer 307, the host material in the light-emitting layer 306, and the guest material in the light-emitting layer 306 satisfy the above-described relation regarding energy of the T1 level.

Further, the electron-transport layer 307 is not limited to a single layer and may be a stack of two or more layers containing any of the above substances.

The electron-injection layer 308 is a layer containing a substance having a high electron-injection property. For the electron-injection layer 308, an alkali metal, an alkaline earth metal, magnesium (Mg), or a compound of any of the above metals such as lithium fluoride (LiF), cesium fluoride (CsF), calcium fluoride ($CaF_2$), or lithium oxide ($LiO_x$) can be used. Alternatively, a rare earth metal compound like erbium fluoride ($ErF_3$) can be used. Further alternatively, the above-mentioned substances for forming the electron-transport layer 307 can also be used.

The electron-injection layer 308 may be formed using a composite material in which an organic compound and an electron donor are mixed. The composite material is superior in an electron-injection property and an electron-transport property, because electrons are generated in the organic compound by the electron donor. In this case, the organic compound is preferably a material excellent in transporting the generated electrons. Specifically, the above-described substances for forming the electron-transport layer 307 (e.g., a metal complex and a heteroaromatic compound) or the like can be used. As the electron donor, a substance showing an electron-donating property with respect to the organic compound may be used. Preferable examples are an alkali metal, an alkaline earth metal, and a rare earth metal. Specifically, magnesium and the like can be used as well as lithium, cesium, calcium, erbium, and ytterbium. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

Note that each of the above-described hole-injection layer 304, hole-transport layer 305, light-emitting layer 306, electron-transport layer 307, and electron-injection layer 308 (including the above-described charge generation layer) can be formed by a method such as an evaporation method (e.g., a vacuum evaporation method), an ink-jet method, or a coating method.

Light emission obtained in the light-emitting layer 306 of the above-described light-emitting element is extracted to the outside through either the first electrode 301 or the second electrode 302 or both. Therefore, one or both of the first electrode 301 and the second electrode 302 are electrodes having a light-transmitting property.

The above-described light-emitting element is a fluorescent light-emitting element which emits light using a singlet exciton generated by triplet-triplet annihilation (TTA) from a triplet exciton which generally makes no contribution to light emission. Thus, the light-emitting element can have higher efficiency than a conventional light-emitting element using a fluorescent compound.

The light-emitting element described in this embodiment is one example of a fluorescent light-emitting element using energy transfer due to TTA for light emission. Further, as a light-emitting device including the above-described light-emitting element, a passive matrix light-emitting device and an active matrix light-emitting device can be manufactured. It is also possible to manufacture a light-emitting device with a microcavity structure including a light-emitting element, which is different from the above-described light-emitting elements. Each of the above-described light-emitting devices is included in the present invention.

Note that there is no particular limitation on the structure of the TFT in the case of manufacturing the active matrix light-emitting device. For example, a staggered TFT or an inverted staggered TFT can be used as appropriate. Further, a driver circuit formed over a TFT substrate may be formed of both an n-type TFT and a p-type TFT or only either an n-type TFT or a p-type TFT. Furthermore, there is also no particular limitation on crystallinity of a semiconductor film used for the TFT. For example, either an amorphous semiconductor film or a crystalline semiconductor film may be used. Examples of a semiconductor material include Group IV semiconductors (e.g., silicon and germanium), compound semiconductors (including oxide semiconductors), and organic semiconductors.

Note that the structure described in this embodiment can be used in combination with any of the structures described in the other embodiments, as appropriate.

Embodiment 3

In this embodiment, as one embodiment of the present invention, a light-emitting element in which a plurality of EL layers are included so as to sandwich a charge-generation layer will be described. Such a light-emitting element is hereinafter referred to as "tandem light-emitting element".

Figure 4A:
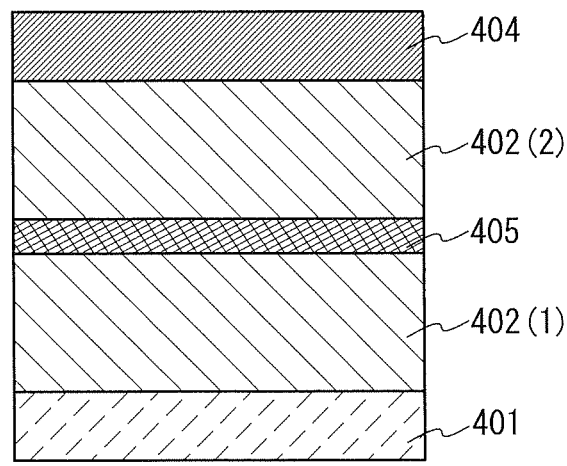
FIGS. 4A and 4B each illustrate a structure of a light-emitting element.

As illustrated in FIG. 4A, the light-emitting element described in this embodiment is a tandem light-emitting element including a plurality of EL layers (a first EL layer 402(1) and a second EL layer 402(2)) between a pair of electrodes (a first electrode 401 and a second electrode 404).

In this embodiment, the first electrode 401 functions as an anode, and the second electrode 404 functions as a cathode. Note that the first electrode 401 and the second electrode 404 can each have the same structures as in Embodiment 2. At least one of the plurality of EL layers (the first EL layer 402(1) and the second EL layer 402(2)) preferably has a structure similar to that of the EL layer described in Embodiment 1. Furthermore, a structure of a hole-transport layer and a structure of the light-emitting layer in contact with the hole-transport layer are preferably the same as those described in Embodiment 1.

A charge-generation layer (I) 405 is provided between the plurality of EL layers (the first EL layer 402(1) and the second EL layer 402(2)). The charge-generation layer (I) 405 has a function of injecting electrons into one of the EL layers and injecting holes into the other of the EL layers when a voltage is applied between the first electrode 401 and the second electrode 404. In this embodiment, when voltage is applied such that the potential of the first electrode 401 is higher than that of the second electrode 404, the charge-generation layer (I) 405 injects electrons into the first EL layer 402(1) and injects holes into the second EL layer 402(2).

Note that in terms of light extraction efficiency, the charge-generation layer (I) 405 preferably has a light-transmitting property with respect to visible light (specifically, the charge-generation layer (I) 405 has a visible light transmittance of 40% or more). Further, the charge generation layer (I) 405 functions even if it has lower conductivity than the first electrode 401 or the second electrode 404.

The charge-generation layer (I) 405 may have either a structure in which an electron acceptor (acceptor) is added to an organic compound having a high hole-transport property or a structure in which an electron donor is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances described here are mainly substances having a hole mobility of $1\times10^{-6}$ cm$^2$/Vs or higher. However, substances other than the above substances may be used as long as they are organic compounds having a hole-transport property higher than an electron-transport property.

As the electron acceptor, 7,7,8,8-tetracyano-2,3,5,6-tetrafluoroquinodimethane (abbreviation: F4TCNQ), chloranil, and the like can be given. In addition, transition metal oxides can be given. Moreover, an oxide of metals belonging to Groups 4 to 8 of the periodic table can be used. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling.

On the other hand, in the case of the structure in which an electron donor is added to an organic compound having a high electron-transport property, as the organic compound having a high electron-transport property, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Alternatively, in addition to such a metal complex, PBD, OXD-7, TAZ, Bphen, BCP, or the like can be used. The materials mentioned here are mainly substances each having an electron mobility of $1\times10^{-6}$ cm$^2$/Vs or higher. Note that substances other than the above substances may be used as long as they are organic compounds having an electron-transport property higher than a hole-transport property.

As the electron donor, it is possible to use an alkali metal, an alkaline earth metal, a rare earth metal, a metal belonging to Group 2 or 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

Note that forming the charge generation layer (I) 405 by using any of the above materials can suppress a drive voltage increase caused by the stack of the EL layers.

Figure 4B:
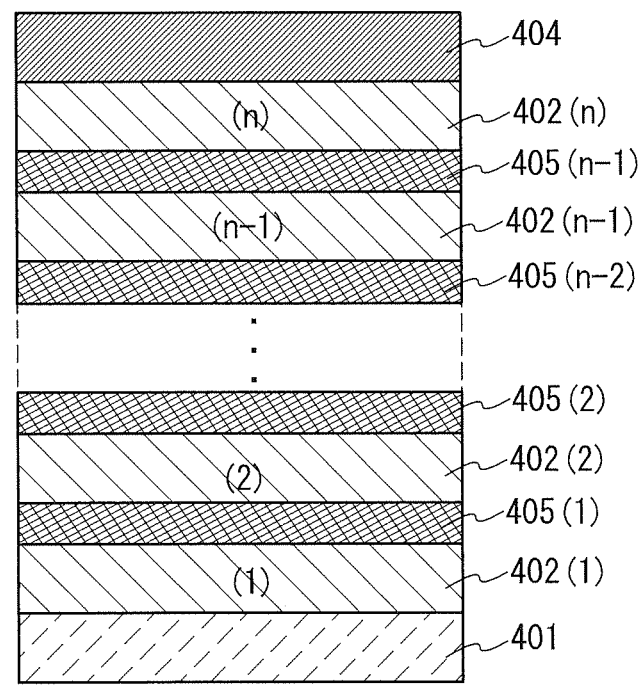

Although the light-emitting element including two EL layers is described in this embodiment, the present invention can be similarly applied to a light-emitting element in which n EL layers (402(1) to 402(n)) (n is three or more) are stacked as illustrated in FIG. 4B. In the case where a plurality of EL layers are included between a pair of electrodes as in the light-emitting element according to this embodiment, by providing charge generation layers (I) (405(1) to 405(n−1)) between the EL layers, light emission in a high luminance region can be obtained with current density kept low. Since the current density can be kept low, the element can have a long lifetime. In addition, when the light emitting element is applied to a lighting system for example, uniform light emission in a large area is possible because voltage drop due to resistance of an electrode material can be decreased. A light-emitting device that can be driven at a low voltage and has low power consumption can be realized.

When the EL layers have different emission colors, a desired emission color can be obtained from the whole light-emitting element. For example, in the light-emitting element having two EL layers, when an emission color of the first EL layer and an emission color of the second EL layer are made to be complementary colors, a light-emitting element emitting white light as a whole light-emitting element can also be obtained. Note that the word "complementary" means color relationship in which an achromatic color is obtained when colors are mixed. In other words, when light obtained from a light-emitting substance and light of a complementary color are mixed, white emission can be obtained.

Also in a light-emitting element having three EL layers, for example, white light as a whole light-emitting element can be similarly obtained when an emission color of a first EL layer is red, an emission color of a second EL layer is green, and an emission color of a third EL layer is blue.

Note that the structure described in this embodiment can be combined as appropriate with any of the structures described in the other embodiments.

Embodiment 4

In this embodiment, a light-emitting device manufactured using the light-emitting element of one embodiment of the present invention is described.

The light-emitting device may be either a passive matrix light-emitting device or an active matrix light-emitting device. Note that any of the light-emitting elements described in the other embodiments can be used for the light-emitting device described in this embodiment.

In this embodiment, an active matrix type light-emitting device is described with reference to FIGS. 5A and 5B.

Figure 5A:
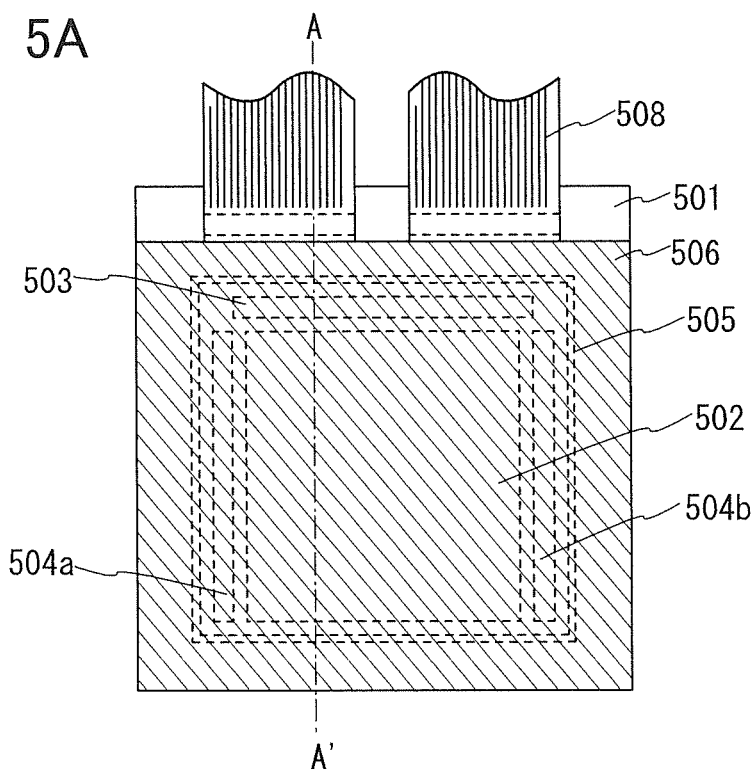
FIGS. 5A and 5B illustrate a light-emitting device.
Figure 5B:
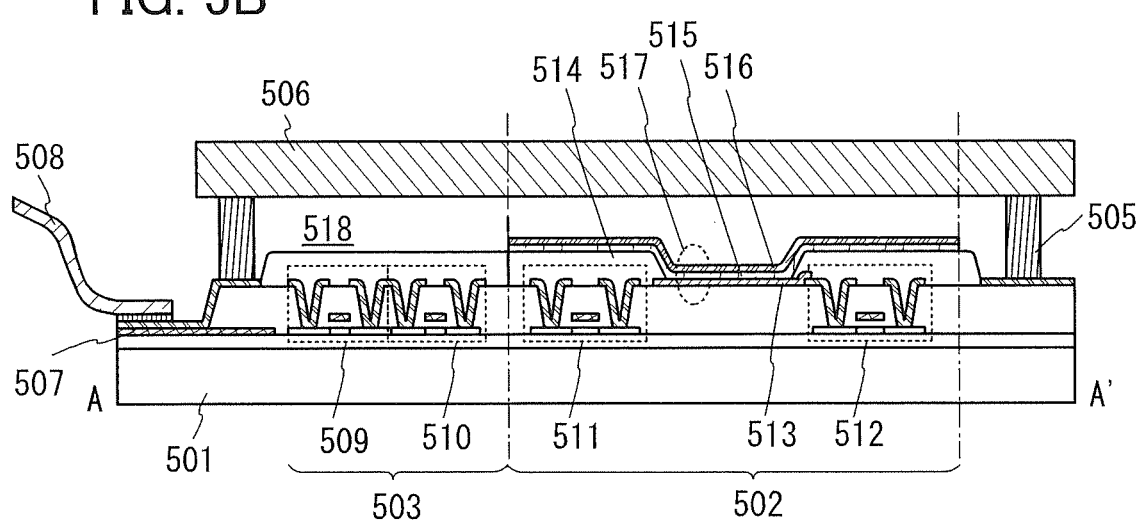

Note that FIG. 5A is a top view illustrating a light-emitting device and FIG. 5B is a cross-sectional view taken along chain line A-A' in FIG. 5A. The active matrix light-emitting device according to this embodiment includes a pixel portion 502 provided over an element substrate 501, a driver circuit portion (a source line driver circuit) 503, and driver circuit portions (gate line driver circuits) 504 (504a and 504b). The pixel portion 502, the driver circuit portion 503, and the driver circuit portions 504 are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portion 504, is provided. Here, an example is described in which a flexible printed circuit (FPC) 508 is provided as the external input terminal. Although only the FPC is shown here, the FPC may be provided with a printed wiring board (PWB). The light-emitting device in this specification includes not only a main body of the light-emitting device but also the light-emitting device with an FPC or a PWB attached.

Next, a cross-sectional structure is described with reference to FIG. 5B. The driver circuit portion and the pixel portion are formed over the element substrate 501; here are illustrated the driver circuit portion 503 which is the source line driver circuit and the pixel portion 502.

An example is illustrated in which a CMOS circuit which is a combination of an n-channel TFT 509 and a p-channel TFT 510 is formed as the driver circuit portion 503. Note that a circuit included in the driver circuit portion may be formed using various CMOS circuits, PMOS circuits, or NMOS circuits. Although a driver integrated type in which the driver circuit is formed over the substrate is described in this embodiment, the driver circuit may not necessarily be formed over the substrate, and the driver circuit can be formed outside, not over the substrate.

The pixel portion 502 is formed of a plurality of pixels each of which includes a switching TFT 511, a current control TFT 512, and a first electrode (anode) 513 which is electrically connected to a wiring (a source electrode or a drain electrode) of the current control TFT 512. Note that an insulator 514 is formed to cover end portions of the first electrode (anode) 513. In this embodiment, the insulator 514 is formed using a positive photosensitive acrylic resin.

In addition, in order to obtain favorable coverage by a film which is to be stacked over the insulator 514, the insulator 514 is preferably formed so as to have a curved surface with curvature at an upper edge portion or a lower edge portion. For example, the insulator 514 can be formed using either a negative photosensitive resin or a positive photosensitive resin. The material of the insulator 514 is not limited to an organic compound and an inorganic compound such as silicon oxide or silicon oxynitride can also be used.

An EL layer 515 and a second electrode (cathode) 516 are stacked over the first electrode (anode) 513. It is preferable that in the EL layer 515, at least a light-emitting layer be provided, and in addition to the light-emitting layer, a hole-injection layer, a hole-transport layer, an electron-transport layer, an electron-injection layer, an electron generation layer, and the like be provided as appropriate.

A light-emitting element 517 is formed of a stacked structure of the first electrode (anode) 513, the EL layer 515, and the second electrode (cathode) 516. For the first electrode (anode) 513, the EL layer 515, and the second electrode (cathode) 516, the materials described in Embodiment 2 can be used. Although not illustrated, the second electrode (cathode) 516 is electrically connected to the FPC 508 which is an external input terminal.

In addition, although the cross-sectional view of FIG. 5B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be manufactured by a combination with color filters.

The sealing substrate 506 is attached to the element substrate 501 with the sealant 505, whereby a light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin or glass frit is preferably used for the sealant 505. The material preferably allows as little moisture and oxygen as possible to penetrate. As the sealing substrate 506, a glass substrate, a quartz substrate, or a plastic substrate formed of fiber reinforced plastic (FRP), poly(vinyl fluoride) (PVF), polyester, acrylic, or the like can be used. In the case where glass frit is used as the sealant, the element substrate 501 and the sealing substrate 506 are preferably glass substrates.

As described above, an active matrix light-emitting device can be obtained.

Note that the structure described in this embodiment can be combined as appropriate with any of the structures described in the other embodiments.

Embodiment 5

In this embodiment, examples of a variety of electronic devices which are completed using a light-emitting device, which is formed using a light-emitting element of one embodiment of the present invention, are described with reference to FIGS. 6A to 6D and FIGS. 7A to 7C.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices are shown in FIGS. 6A to 6D.

Figure 6A:
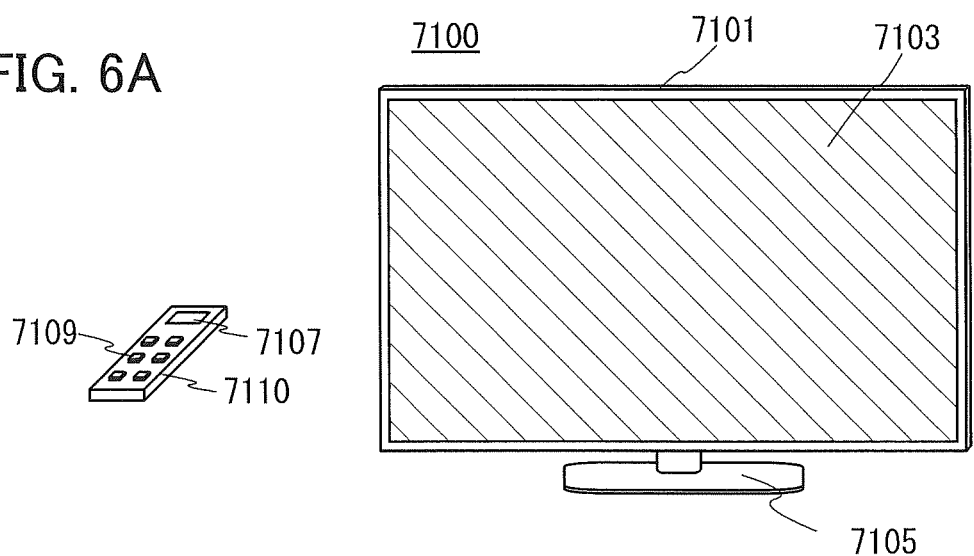
FIGS. 6A to 6D each illustrate an electronic device.

FIG. 6A illustrates an example of a television device. In the television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 6B:
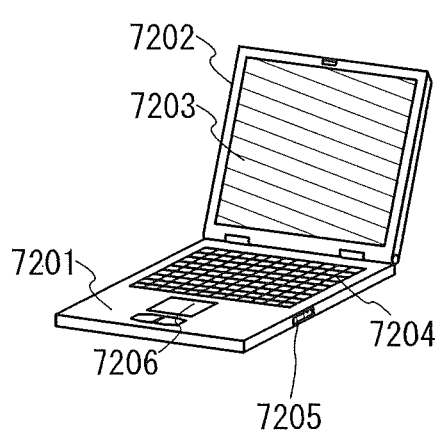

FIG. 6B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

Figure 6C:
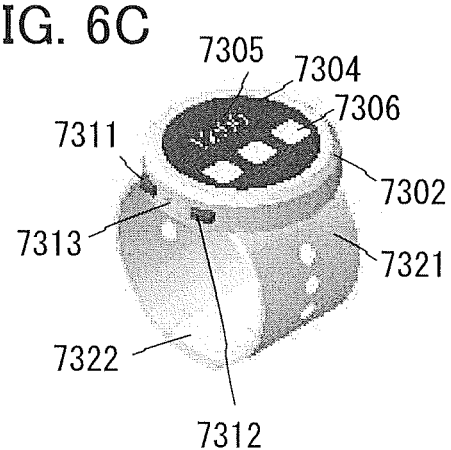

FIG. 6C illustrates a smart watch. The smart watch can include a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch in FIG. 6C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 6D:
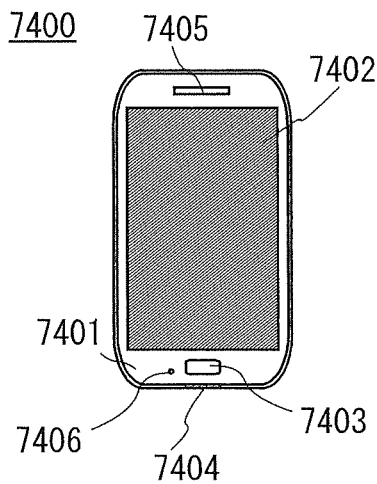

FIG. 6D illustrates an example of a cellular phone. A cellular phone 7400 is provided with a display portion 7402 incorporated in a housing 7401, an operation button 7403, an external connection port 7404, a speaker 7405, a microphone 7406, and the like. Note that the mobile phone 7400 is manufactured using a light-emitting device for the display portion 7402.

When the display portion 7402 of the cellular phone 7400 illustrated in FIG. 6D is touched with a finger or the like, data can be input to the cellular phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, when a backlight or a sensing light source which emits near-infrared light is provided in the display portion, an image of a finger vein, a palm vein, or the like can be taken.

Figure 7A:
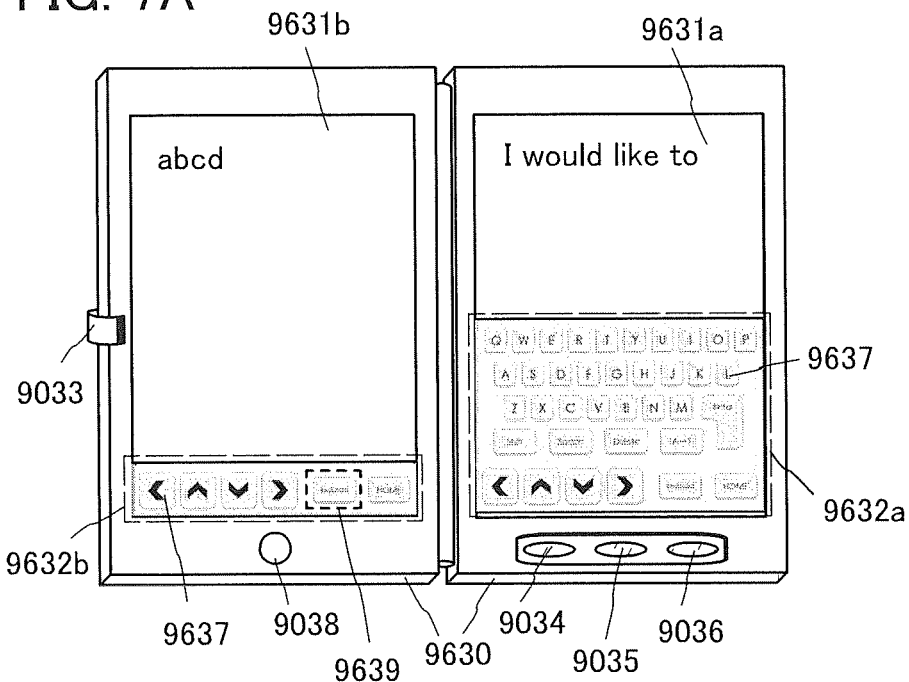
FIGS. 7A to 7C illustrate an electronic device.
Figure 7B:
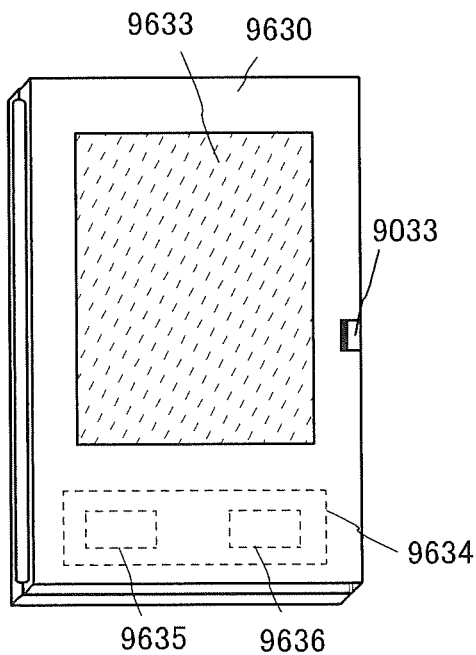

FIGS. 7A and 7B illustrate a foldable tablet terminal. The tablet terminal is opened in FIG. 7A. The tablet terminal includes a housing 9630, a display portion 9631a, a display portion 9631b, a display mode switch 9034, a power switch 9035, a power saver switch 9036, a clasp 9033, and an operation switch 9038. The tablet terminal is manufactured using a light-emitting device for one or both of the display portion 9631a and the display portion 9631b.

Part of the display portion 9631a can be a touch panel area 9632a and data can be input when a displayed operation key 9637 is touched. Although half of the display portion 9631a has only a display function and the other half has a touch-screen function, one embodiment of the present invention is not limited to the structure. All the area of the display portion 9631a may have a touch panel function. For example, all the area of the display portion 9631a can display keyboard buttons and serve as a touch panel while the display portion 9631b can be used as a display screen.

As in the display portion 9631a, part of the display portion 9631b can be a touch panel area 9632b. When a keyboard display switching button 9639 displayed on the touch panel is touched with a finger, a stylus, or the like, a keyboard can be displayed on the display portion 9631b.

Touch input can be performed in the touch panel area 9632a and the touch panel area 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, other detecting devices such as sensors for determining inclination, such as a gyroscope or an acceleration sensor, may be incorporated in the tablet terminal.

Note that FIG. 7A shows an example in which the display portion 9631a and the display portion 9631b have the same display area; however, without limitation thereon, one of the display portions may be different from the other display portion in size and display quality. For example, one of the display portions 9631a and 9631b may display higher definition images than the other.

The tablet terminal is closed in FIG. 7B. The tablet terminal includes the housing 9630, a solar battery 9633, a charge and discharge control circuit 9634, a battery 9635, and a DCDC converter 9636. In FIG. 7B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 7A and 7B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

Figure 7C:
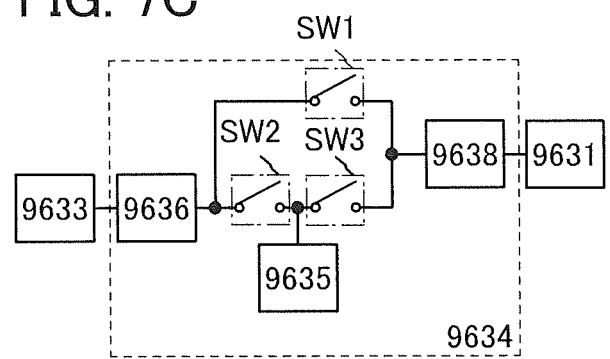

The structure and the operation of the charge and discharge control circuit 9634 illustrated in FIG. 7B will be described with reference to a block diagram in FIG. 7C. The solar battery 9633, the battery 9635, the DCDC converter 9636, a converter 9638, switches SW1 to SW3, and the display portion 9631 are illustrated in FIG. 7C, and the battery 9635, the DCDC converter 9636, the converter 9638, and the switches SW1 to SW3 correspond to the charge and discharge control circuit 9634 illustrated in FIG. 7B.

First, an example of the operation in the case where power is generated by the solar battery 9633 using external light is described. The voltage of power generated by the solar battery 9633 is stepped up or down by the DCDC converter 9636 so that the power has a voltage for charging the battery 9635. When the display portion 9631 is operated with the power from the solar battery 9633, the switch SW1 is turned on and the voltage of the power is raised or lowered by the converter 9638 to a voltage needed for operating the display portion 9631. In addition, when display on the display portion 9631 is not performed, the switch SW1 may be turned off and the switch SW2 may be turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

As described above, the electronic devices can be obtained by application of the light-emitting device according to one embodiment of the present invention. The light-emitting device has a remarkably wide application range, and can be applied to electronic devices in a variety of fields.

Note that the structure described in this embodiment can be combined as appropriate with any of the structures described in the other embodiments.

Embodiment 6

In this embodiment, examples of a lighting device to which a light-emitting device including a light-emitting element of one embodiment of the present invention is applied, are described with reference to FIG. 8.

Figure 8:
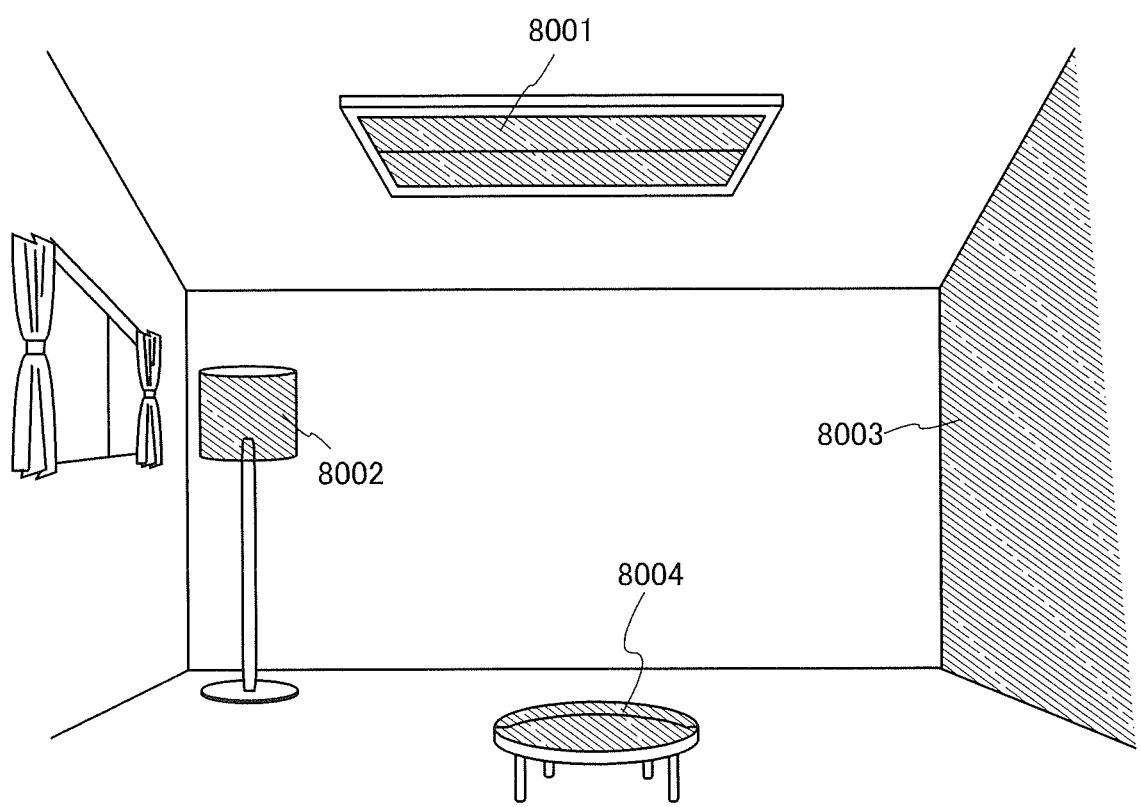
FIG. 8 illustrates lighting devices.

FIG. 8 illustrates an example in which the light-emitting device is used as an indoor lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, when the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

EXAMPLE 1

In this example, calculation of a T1 level and measurement of an S1 level were performed on substances used for the light-emitting element of one embodiment of the present invention.

The light-emitting element of one embodiment of the present invention is a fluorescent light-emitting element. An intersystem crossing is not likely to occur in a fluorescent material and a very weak light is emitted from a triplet exciton; therefore, it is difficult to measure a T1 level of a fluorescent material. Therefore, quantum chemical calculation was performed to calculate the T1 level. On the other hand, an S1 level of a fluorescent material was estimated by measurement of an absorption spectrum.

The calculating method is as follows. Note that Gaussian 09 was used as the quantum chemistry computational program. A high performance computer (Altix 4700, manufactured by SGI Japan, Ltd.) was used for the calculation.

First, the most stable structure in the singlet state was calculated using the density functional theory. As a basis function, 6-311 (a basis function of a triple-split valence basis set using three contraction functions for each valence orbital) was applied to all the atoms. By the above basis function, for example, orbits of 1s to 3s are considered in the case of hydrogen atoms while orbits of 1s to 4s and 2p to 4p are considered in the case of carbon atoms. Furthermore, to improve calculation accuracy, the p function and the d function as polarization basis sets were added respectively to hydrogen atoms and atoms other than hydrogen atoms. As a functional, B3LYP was used.

Next, the most stable structure in the triplet state was calculated. The energy of the T1 level was calculated from an energy difference between the most stable structures in the singlet state and in the triplet state. As a basis function, 6-311G (d, p) was adopted. As a functional, B3LYP was used.

The S1 level was estimated in the following manner. First, a thin film (approximately 500 nm) was formed over a quartz substrate by a vacuum evaporation method to form a thin film sample, and an absorption spectrum of the thin film sample was measured. The absorption spectrum of the thin film sample was measured using an ultraviolet-visible spectrophotometer (V-550, produced by JASCO Corporation). Then, the absorption spectrum of quartz was subtracted from the measured absorption spectrum of the sample. The absorption edge of the absorption spectrum of the thin film was obtained, and the absorption edge was regarded as the S1 level.

Fluorescent materials used for the measurement are as follows: N,N'-bis(3-methylphenyl)-N,N'-bis[3-(9-phenyl-9H-fluoren-9-yl)phenyl]pyrene-1,6-diamine (abbreviation: 1,6mMemFLPAPrn); 9-[4-(10-phenyl-9-anthracenyl)phenyl]-9H-carbazole (abbreviation: CzPA); 3-[4-(1-naphthyl)-phenyl]-9-phenyl-9H-carbazole (abbreviation: PCPN); and 9-phenyl-3-[4-(10-phenyl-9-anthryl)phenyl]-9H-carbazole (abbreviation: PCzPA). Measurement results are shown in Table 1 below.

TABLE 1

| Sample | S1 level (actual measurement) [eV] | T1 level (calculation) [eV] |
| --- | --- | --- |
| 1,6mMemFLPAPrn | 2.68 | 1.74 |
| CzPA | 2.95 | 1.65 |
| PCPN | 3.48 | 2.36 |
| PCzPA | 2.92 | 1.65 |

In this example, phosphorescence of the material was measured to support the quantum chemical calculation. The substance used for the light-emitting element of one embodiment of the present invention has very high fluorescence quantum efficiency, and accordingly, it is very difficult to directly observe phosphorescence from the thin film sample including the single material by low-temperature PL measurement. Hence, the following method using a triplet sensitizer was employed to measure phosphorescence and to estimate a T1 level.

A co-evaporated film in which Ir(ppy)$_3$ was added as a triplet sensitizer to a fluorescent material to be measured was formed. The film was subjected to a low-temperature PL method, and a T1 level thereof was estimated from the measured phosphorescent spectrum. The measurement was performed by using a PL microscope, LabRAM HR-PL, produced by HORIBA, Ltd., a He—Cd laser (325 nm) as excitation light, and a CCD detector at a measurement temperature of 10 K. The co-evaporation of Ir(ppy)$_3$ and the fluorescent material increases the probability of occurrence of an intersystem crossing in the fluorescent material to be measured. Thus, phosphorescence from the fluorescent material can be measured, which is difficult to achieve when the co-evaporation is not employed.

For the measurement, a thin film was formed over a quartz substrate to a thickness of 30 nm and another quartz substrate was attached to the deposition surface in a nitrogen atmosphere. Table 2 shows the measurement results. The results indicate that the values of the T1 levels measured in this example are close to the values of the T1 levels calculated by the quantum chemical calculation. Therefore, the values of the T1 levels obtained in this example are citable as parameters for forming the light-emitting element of one embodiment of the present invention.

TABLE 2

| Sample | T1 level (calculation) [eV] | T1 level (actual measurement) [eV] |
| --- | --- | --- |
| 1,6mMemFLPAPrn | 1.74 | 1.84 |
| CzPA | 1.65 | 1.72 |
| PCPN | 2.36 | — |
| PCzPA | 1.65 | — |

EXAMPLE 2

Figure 9:
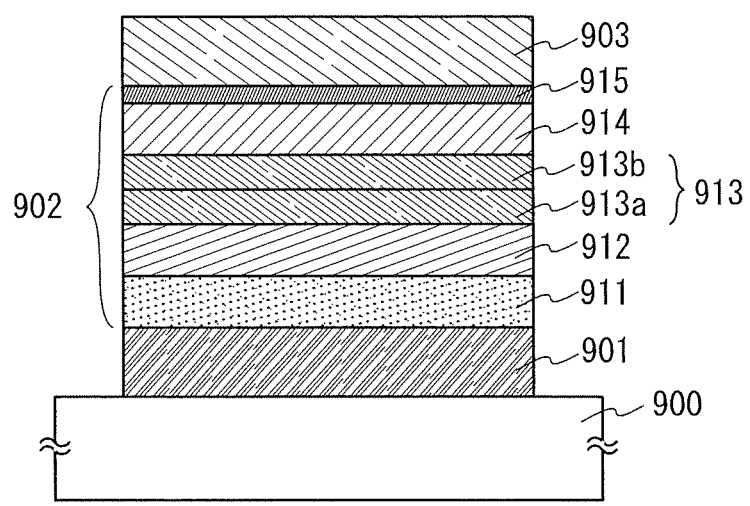
FIG. 9 illustrates a structure of a light-emitting element.

This example shows the measurement results of characteristics of a light-emitting element 1 formed as the light-emitting element of one embodiment of the present invention. In the light-emitting element 1, a hole-transport layer includes a hole-transport material (abbreviation: PCPN) having a T1 level higher than a T1 level of a host material of a light-emitting layer. This example also shows the measurement results of characteristics of a comparative light-emitting element 2 in which a hole-transport layer includes a hole-transport material (abbreviation: PCzPA) having a T1 level lower than or equal to the T1 level of the host material of the light-emitting layer. Note that in this example, the light-emitting element 1 and the comparative light-emitting element 2 are described with reference to FIG. 9. Chemical formulae of materials used in this example are shown below.

[Chemical Formula 1]

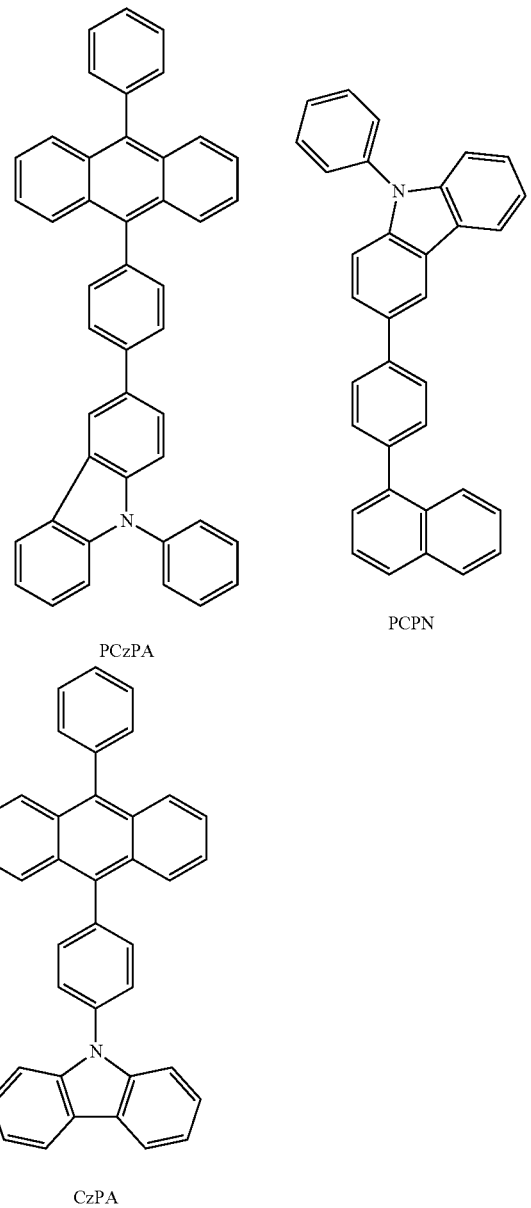

PCzPA

PCPN

CzPA

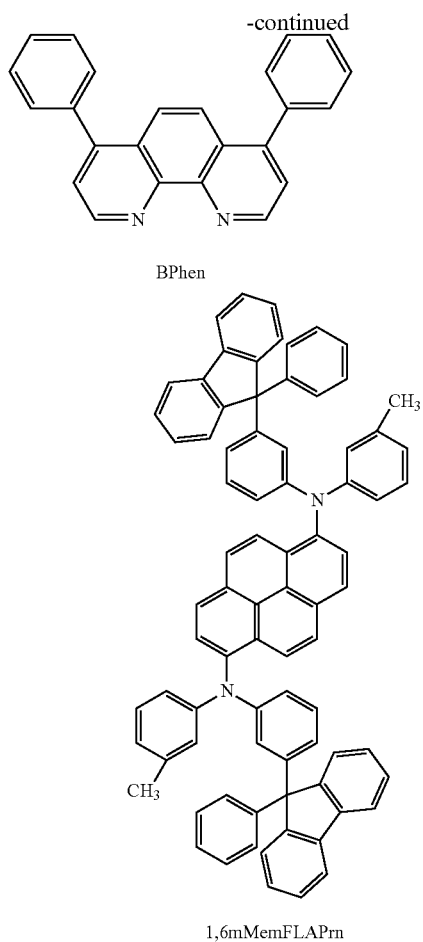

BPhen 1,6mMemFLAPrn

<<Formation of Light-Emitting Element 1 and Comparative Light-Emitting Element 2>>

First, indium tin oxide containing silicon oxide (ITSO) was deposited over a glass substrate 900 by a sputtering method, so that a first electrode 901 which functions as an anode was formed. It is to be noted that the film thickness of the first electrode was set to be 110 nm and that the area of the electrode was set to be 2 mm×2 mm.

Next, as pretreatment for forming the light-emitting element over the substrate 900, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 900 was cooled down for approximately 30 minutes.

Next, the substrate 900 over which the first electrode 901 was formed was fixed to a holder provided inside a vacuum evaporation apparatus so that the surface over which the first electrode was formed faced downward. In this example, a case will be described in which a hole-injection layer 911, a hole-transport layer 912, a light-emitting layer 913, an electron-transport layer 914, and an electron-injection layer 915 which are included in an EL layer 902 are sequentially formed by a vacuum evaporation method.

After the pressure in the vacuum evaporation apparatus was reduced to $10^{-4}$ Pa, 9-phenyl-3-[4-(10-phenyl-9-anthryl)phenyl]-9H-carbazole (abbreviation: PCzPA) and molybdenum(VI) oxide were deposited by co-evaporation with a weight ratio of PCzPA to molybdenum oxide being 4:2, thereby forming the hole-injection layer 911 on the first electrode 901. The thickness thereof was set to 50 nm. Note that a co-evaporation method is an evaporation method in which a plurality of different substances are concurrently vaporized from respective different evaporation sources.

Next, 3-[4-(1-naphthyl)-phenyl]-9-phenyl-9H-carbazole (abbreviation: PCPN) was deposited to a thickness of 30 nm by evaporation, thereby forming the hole-transport layer 912 of the light-emitting element 1. The hole-transport layer 912 of the comparative light-emitting element 2 was formed by depositing PCzPA to a thickness of 30 nm by evaporation on the hole-injection layer 911.

Next, the light-emitting layer 913 was formed on the hole-transport layer 912. First, 9-[4-(10-phenyl-9-anthracenyl)phenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were deposited by co-evaporation with a weight ratio of CzPA to 1,6mMemFLPAPrn being 1:0.05. The thickness thereof was set to 25 nm. Thus, the light-emitting layer 913 was formed.

Then, bathophenanthroline (abbreviation: Bphen) was deposited to a thickness of 25 nm by evaporation on the light-emitting layer 913, thereby forming the electron-transport layer 914. Furthermore, lithium fluoride was deposited to a thickness of 1 nm by evaporation on the electron-transport layer 914, thereby forming the electron-injection layer 915.

Finally, aluminum was deposited to a thickness of 200 nm by evaporation on the electron-injection layer 915, thereby forming the second electrode 903 serving as a cathode; thus, the light-emitting element 1 was obtained. It is to be noted that an evaporation method using resistive heating was employed for all the evaporation steps.

Table 3 shows element structures of the light-emitting element 1 and the comparative light-emitting element 2 which are obtained as described above.

TABLE 3

| | Light-emitting element 1 | Comparative light-emitting element 2 |
|---|---|---|
| First electrode | ITSO (110 nm) | |
| Hole-injection layer | PCzPA:MoOx (2:1 50 nm) | |
| Hole-transport layer | PCPN (30 nm) | PCzPA (30 nm) |
| Light-emitting layer | CzPA:1,6mMemFLPAPrn (1:0.05 25 nm) | |
| Electron-transport layer | Bphen (25 nm) | |
| Electron-injection layer | LiF (1 nm) | |
| Second electrode | Al (200 nm) | |

The formed light-emitting element 1 and comparative light-emitting element 2 were sealed in a glove box containing a nitrogen atmosphere so as not to be exposed to the air (a sealant was applied onto outer edges of the elements and heat treatment was performed at 80° C. for 1 hour at the time of sealing).

<<Measurement of Fluorescence Lifetimes of Light-Emitting Element 1 and Comparative Light-Emitting Element 2>>

Figure 10:
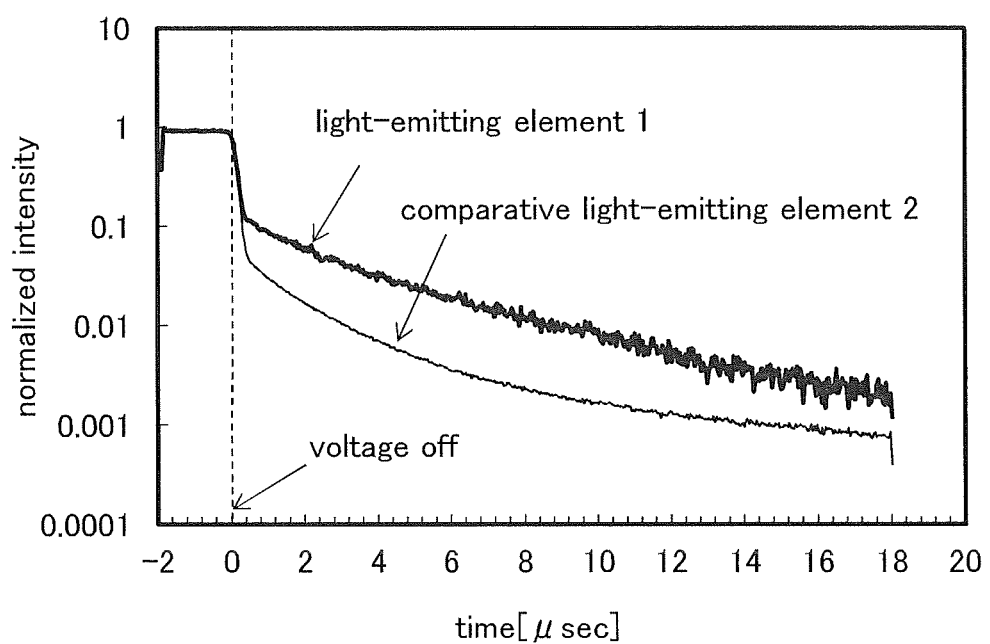
FIG. 10 shows fluorescence lifetimes of a light-emitting element 1 and a comparative light-emitting element 2.

A fluorescence lifetime of each of the formed light-emitting element 1 and comparative light-emitting element 2 was measured using a picosecond fluorescence lifetime measurement system (manufactured by Hamamatsu Photonics K.K.). In this measurement, the fluorescence lifetime of the light-emitting element was measured as follows. A square wave pulse voltage was applied to the light-emitting element, and light which was attenuated from the falling of the voltage underwent time-resolved measurement using a streak camera. The pulse voltage was applied at a frequency of 10 Hz. By integrating data obtained by repeated measurement, data with a high S/N ratio was obtained. The measurement was performed at room temperature (300 K) under the conditions of a pulse voltage of 3.5 V, a pulse time width of 10 μsec, and a measurement time of 20 μsec. FIG. 10 shows the measurement results. Note that in FIG. 10, the vertical axis represents normalized intensity when emission intensity in a state where carriers were steadily injected (when the pulse voltage was ON) was regarded as 1. The horizontal axis represents time elapsed after the falling of the pulse voltage.

The attenuation curve of the light-emitting element 1 of FIG. 10 was fitted with an exponential. As a result of the fitting, the fluorescence lifetime τ of the light-emitting element 1 was estimated to be 1.50 μsec. Generally, the lifetime of fluorescence is several nanoseconds. Thus, light measured from the light-emitting element 1 was probably fluorescence including a delayed fluorescence component. Furthermore, the fluorescence lifetime τ of the comparative light-emitting element 2 was estimated to be 1.52 μsec. These results show that fluorescence including a delayed fluorescence component is probably emitted from each of the light-emitting element 1 and the comparative light-emitting element 2.

Figure 12:
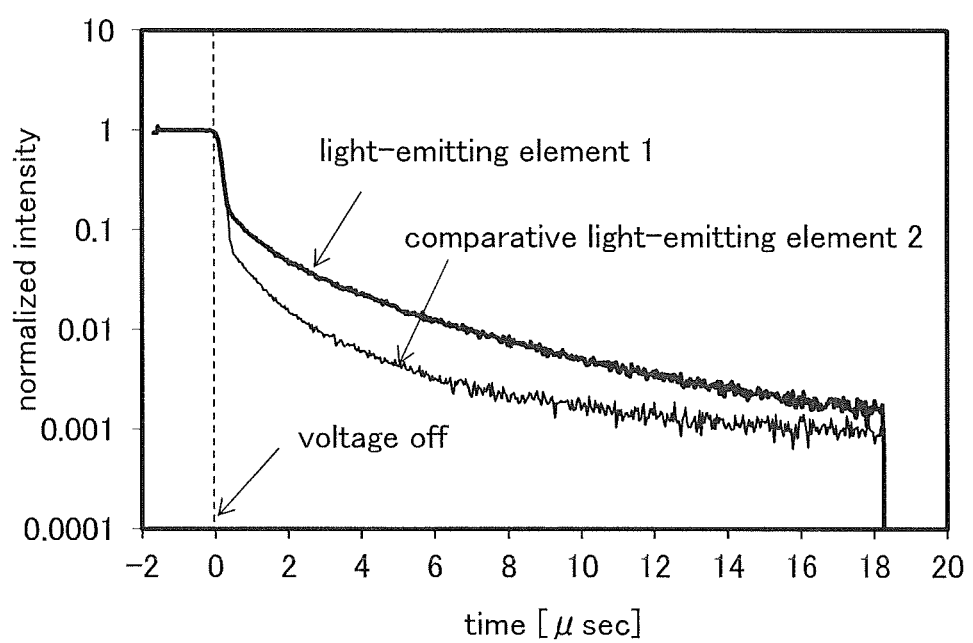
FIG. 12 shows fluorescence lifetimes of the light-emitting element 1 and the comparative light-emitting element 2.

Note that other than the generation of a singlet exciton due to triplet-triplet annihilation (TTA), possible causes of the delayed fluorescence in the fluorescence measurement described with reference to FIG. 10 include the generation of a singlet exciton due to recombination of carriers remaining in the light-emitting element when the pulse voltage is OFF. To inhibit the recombination of the remaining carriers, the light-emitting element 1 and the comparative light-emitting element 2 of FIG. 10 were subjected to measurement using a similar device under similar conditions where a continuous application of a negative bias voltage (−5 V) was added to the aforementioned measurement conditions. FIG. 12 shows the measurement results. A fluorescence including a delayed fluorescence component was measured also in the measurement results of FIG. 12 under the aforementioned conditions further including application of the negative bias to possibly inhibit the recombination of the remaining carriers, as clear from comparison with the measurement results of FIG. 10. Thus, it is confirmed that the delayed fluorescence components shown in the measurement results of FIG. 10 and FIG. 12 were due to light emission owing to TTA.

As shown in FIG. 10 and FIG. 12, the normalized emission intensity of the delayed fluorescence component of the comparative light-emitting element 2 is lower than the normalized emission intensity of the delayed fluorescence component of the light-emitting element 1. This is probably due to the following. The T1 level of the hole-transport material (PCzPA) of the hole-transport layer of the comparative light-emitting element 2 is lower than or equal to the T1 level of the host material (CzPA) of the light-emitting layer of the comparative light-emitting element 2, while the T1 level of the hole-transport material (PCPN) of the hole-transport layer of the light-emitting element 1 is higher than the T1 level of the host material (CzPA) of the light-emitting layer of the light-emitting element 1. Furthermore, the S1 level of PCPN is higher than the S1 level of CzPA, and therefore, excitation energy of CzPA is possibly inhibited from being transferred to PCPN. That is, it is presumable that, in the structure of the light-emitting element 1, a triplet exciton generated in the light-emitting layer is kept in the light-emitting layer, thereby increasing the probability of occurrence of TTA.

Figure 11:
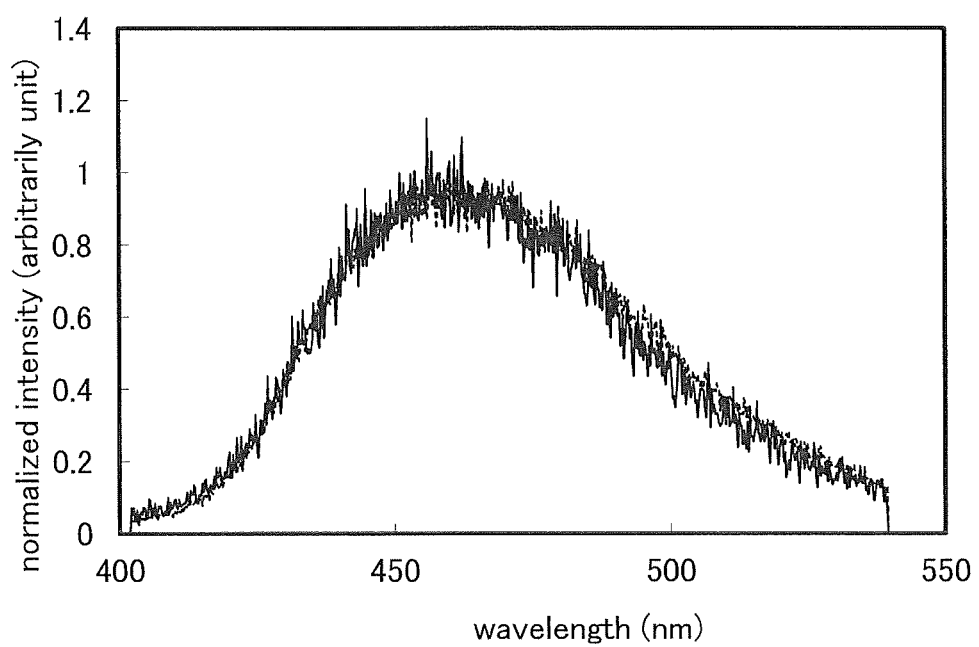
FIG. 11 shows a fluorescent spectrum of the light-emitting element 1.

In FIG. 11, an emission spectrum of the delayed fluorescence component of the light-emitting element 1 shown in FIG. 10 is indicated by a solid line. Furthermore, an emission spectrum of fluorescence in a state where carriers were steadily injected to the light-emitting element 1 (when the pulse voltage was ON) is indicated by a dashed line as a comparative example. Note that the vertical axis in FIG. 11 represents normalized intensity when the maximum emission intensity was regarded as 1.

FIG. 11 shows that light emission of the delayed fluorescence component and the fluorescence in the state where carrier are steadily injected (when the pulse voltage is ON) exhibit approximately the same emission spectrum in shape and each of them is light emission from the guest material (1,6mMemFLPAPrn). Thus, it is probable that delayed fluorescence, which may correspond to light emission from a singlet generated by TTA, is emitted from the guest material, not from the host material or the like.

<<Operation Characteristics of Light-Emitting Element 1 and Comparative Light-Emitting Element 2>>

Operation characteristics of the formed light-emitting element 1 and comparative light-emitting element 2 were measured. It is to be noted that the measurement was performed at room temperature (in an atmosphere kept at 25° C.).

Table 4 below shows initial values of main characteristics of the light-emitting element 1 and the comparative light-emitting element 2 at a luminance of approximately 1000 cd/m².

TABLE 4

| | Voltage (V) | Current (mA) | Current density (mA/cm²) | Chromaticity (x, y) | Luminance (cd/m²) | Current efficiency (cd/A) | Power efficiency (lm/W) | External quantum efficiency (%) |
|---|---|---|---|---|---|---|---|---|
| Light-emitting element 1 | 3.2 | 0.52 | 13 | (0.14, 0.17) | 1100 | 8.1 | 8 | 6.4 |
| Comparative light-emitting element 2 | 3.2 | 0.52 | 13 | (0.14, 0.17) | 870 | 6.6 | 6.5 | 5.2 |

From the above results, it is found that the light-emitting element 1 formed in this example has higher current efficiency and higher external quantum efficiency than the comparative light-emitting element 2.

That is, when the hole-transport layer is formed using the substance having a T1 level higher than that of the host material of the light-emitting layer, it is probable that a triplet exciton generated in the light-emitting layer can be prevented from diffusing to the outside of the light-emitting layer; thus, TTA can occur in the light-emitting layer efficiently. Furthermore, the intensity of the delayed fluorescent component due to TTA is increased, and as a result of this, the light-emitting property of the light-emitting element 1 is improved.

EXAMPLE 3

This example shows the measurement results of characteristics of a light-emitting element 3 and a comparative light-emitting element 4. In the light-emitting element 3 formed as the light-emitting element of one embodiment of the present invention, a light-emitting layer was formed using 1,6mMemFLPAPrn as a guest material (fluorescent dopant) and CzPA as a host material. The T1 level of CzPA is lower than that of 1,6mMemFLPAPrn. In the comparative light-emitting element formed as a comparative example, a light-emitting layer was formed using 1,6mMemFLPAPrn as a guest material (fluorescent dopant) and 35DCzPPy as a host material. The T1 level of 35DCzPPy is higher than that of 1,6mMemFLPAPrn. Note that the T1 level of 35DCzPPy is higher than that of PCPPn used for a hole-transport layer, and the T1 level of PCPPn is higher than that of 1,6mMemFLPAPrn. Furthermore, the S1 level of 35DCzPPy and the S1 level of PCPPn are each higher than that of 1,6mMemFLPAPrn. The light-emitting element 3 and the comparative light-emitting element 4 in this example are described with reference to FIG. 9 in a manner similar to that of Example 2. Chemical formulae of materials used in this example are shown below.

[Chemical Formula 2]

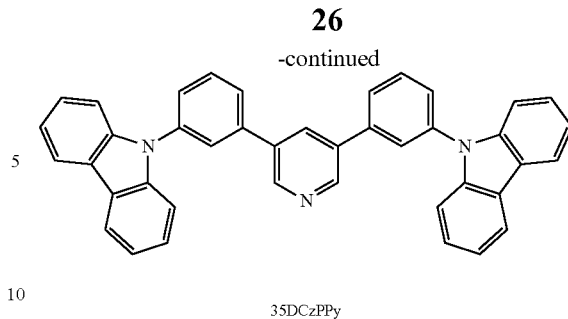

35DCzPPy

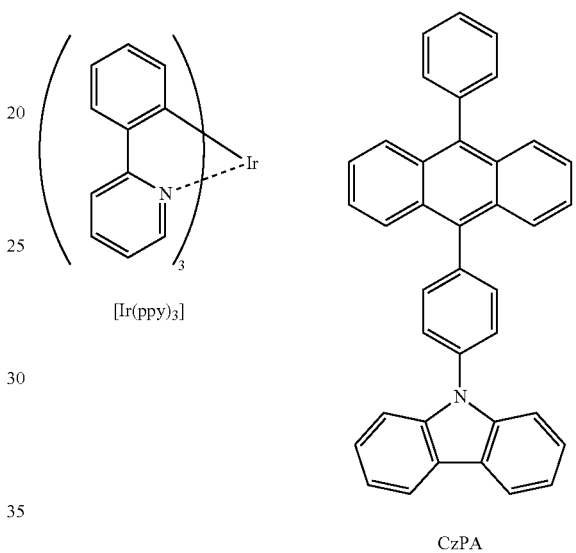

[Ir(ppy)₃]

CzPA

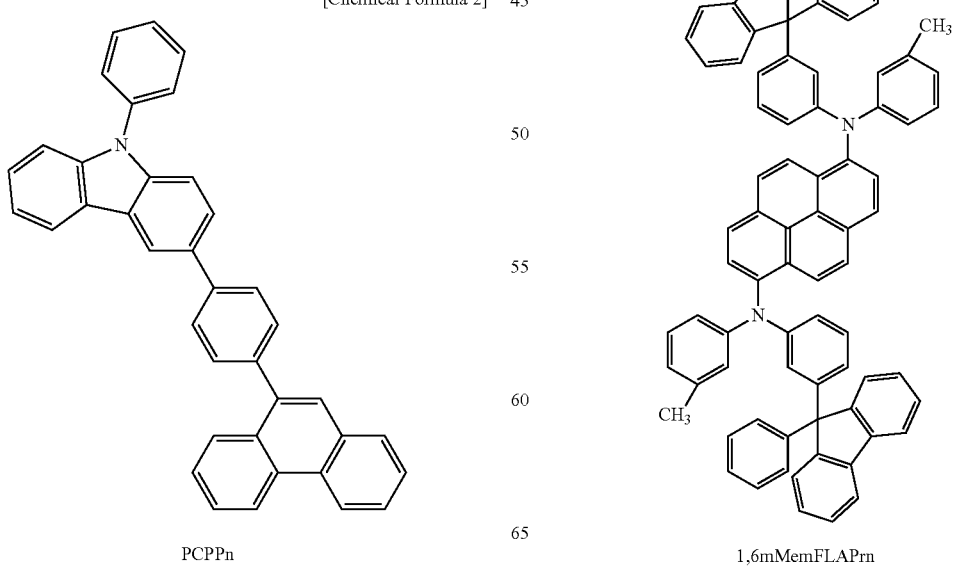

PCPPn 1,6mMemFLAPrn

-continued

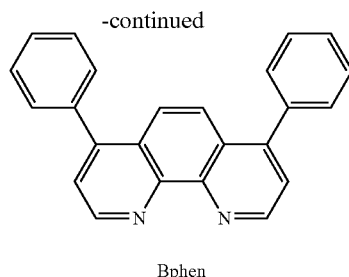

Bphen

<<Formation of Light-Emitting Element 3 and Comparative Light-Emitting Element 4>>

First, indium tin oxide containing silicon oxide (ITSO) was deposited over a glass substrate 900 by a sputtering method, so that a first electrode 901 which functions as an anode was formed. It is to be noted that the film thickness of the first electrode was set to be 110 nm and that the area of the electrode was set to be 2 mm×2 mm.

Next, as pretreatment for forming the light-emitting element over the substrate 900, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 900 was cooled down for approximately 30 minutes.

Next, the substrate 900 over which the first electrode 901 was formed was fixed to a holder provided inside a vacuum evaporation apparatus so that the surface over which the first electrode was formed faced downward. In this example, a case will be described in which a hole-injection layer 911, a hole-transport layer 912, a light-emitting layer 913, an electron-transport layer 914, and an electron-injection layer 915 which are included in an EL layer 902 are sequentially formed by a vacuum evaporation method.

The pressure in the vacuum evaporation apparatus was reduced to $10^{-4}$ Pa. Then, 9-{4-(9-H-9-phenylcarbazol-3-yl)-phenylyl}-phenanthrene (abbreviation: PCPPn) and molybdenum(VI) oxide were deposited by co-evaporation with a mass ratio of PCPPn (abbreviation) to molybdenum oxide being 1:0.5, thereby forming the first hole-injection layer 911 on the first electrode 901. The thickness thereof was set to 20 nm. Note that a co-evaporation method is an evaporation method in which a plurality of different substances are concurrently vaporized from respective different evaporation sources.

Next, PCPPn was deposited to a thickness of 20 nm by evaporation, thereby forming the hole-transport layer 912 of each of the light-emitting element 3 and the comparative light-emitting element 4.

Next, the light-emitting layer 913 was formed on the hole-transport layer 912. In the case of the light-emitting element 3, 9-[4-(10-phenyl-9-anthracenyl)phenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were deposited by co-evaporation with a weight ratio of CzPA (abbreviation) to 1,6mMemFLPAPrn (abbreviation) being 1:0.05. The thickness thereof was set to 25 nm. In the case of the comparative light-emitting element 4, 3,5-bis[3-(9H-carbazol-9-yl)phenyl]pyridine (abbreviation: 35DCzPPy) and 1,6mMemFLPAPrn were deposited by co-evaporation with a weight ratio of 35DCzPPy to 1,6mMemFLPAPrn being 1:0.05. The thickness thereof was set to 25 nm. Thus, the light-emitting layer 913 was formed.

Next, the electron-transport layer 914 was formed on the light-emitting layer 913. In the case of the light-emitting element 3, after CzPA was deposited to a thickness of 10 nm by evaporation, bathophenanthroline (abbreviation: Bphen) was deposited to a thickness of 15 nm by evaporation. In the case of the comparative light-emitting element 4, after 35DczPPy was deposited to a thickness of 10 nm by evaporation, Bphen was deposited to a thickness of 15 nm by evaporation. Furthermore, lithium fluoride was deposited to a thickness of 1 nm by evaporation on the electron-transport layer 914, whereby the electron-injection layer 915 was formed.

Finally, aluminum was deposited to a thickness of 200 nm by evaporation on the electron-injection layer 915 to form the second electrode 903 serving as a cathode; thus, the light-emitting element 3 and the comparative light-emitting element 4 were obtained. It is to be noted that an evaporation method using resistive heating was employed for all the evaporation steps.

Table 5 shows element structures of the light-emitting element 3 and the comparative light-emitting element 4 which are obtained as described above.

TABLE 5

| | Light-emitting element 3 | Comparative light-emitting element 4 |
|---|---|---|
| First electrode | ITSO | |
| | (70 nm) | |
| Hole-injection layer | PcPPn:MoOx (1:0.5 20 nm) | |
| Hole-transport layer | PcPPn | |
| | (20 nm) | |
| Light-emitting layer | CzPA:1, 6mMemFLPAPrn (1:0.05 25 nm) | 35DCzPPy:1, 6mMemFLPAPrn (1:0.05 25 nm) |
| Electron-transport layer | CzPA (10 nm) Bphen (15 nm) | 35DCzPPy (10 nm) Bphen (15 nm) |
| Electron-injection layer | LiF (1 nm) | |
| Second electrode | Al (200 nm) | |

The formed light-emitting element 3 and comparative light-emitting element 4 were sealed in a glove box containing a nitrogen atmosphere so as not to be exposed to the air (a sealant was applied onto outer edges of the elements and heat treatment was performed at 80° C. for 1 hour at the time of sealing).

<<Measurement of Fluorescence Lifetimes of Light-Emitting Element 3 and Comparative Light-Emitting Element 4>>

Figure 13:
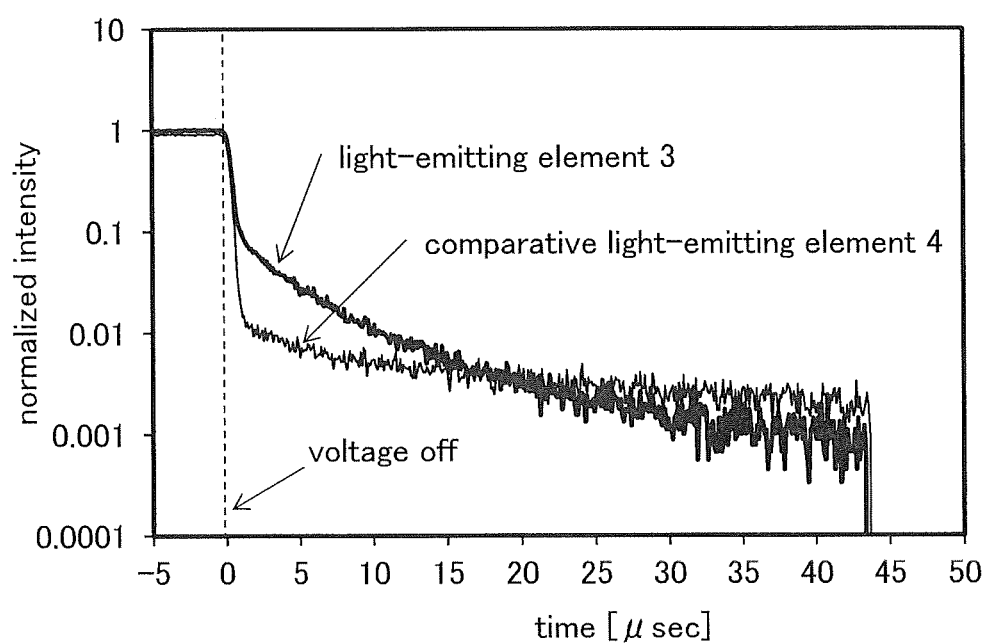
FIG. 13 shows fluorescence lifetimes of a light-emitting element 3 and a comparative light-emitting element 4.

A fluorescence lifetime of each of the formed light-emitting element 3 and comparative light-emitting element 4 was measured using a picosecond fluorescence lifetime measurement system (manufactured by Hamamatsu Photonics K.K.). In this measurement, the fluorescence lifetime of the light-emitting element was measured as follows. A square wave pulse voltage was applied to the light-emitting element, and light which was attenuated from the falling of the voltage underwent time-resolved measurement using a streak camera. The pulse voltage was applied at a frequency of 10 Hz. By integrating data obtained by repeated measurement, data with a high S/N ratio was obtained. The measurement was performed at room temperature (300 K). In the measurement, a pulse voltage of 3.5 V (in the case of the light-emitting element 3) or 5.2 V (in the case of the comparative light-emitting element 4) was applied, a pulse time width was 100 µsec, a negative bias voltage (−10 V) was applied, and a measurement time was 50 µsec. The pulse voltage was adjusted in the light-emitting element 3 and the comparative light-emitting element 4 so that currents flowing in the light-emitting element 3 and the comparative light-emitting element 4 have similar values. FIG. 13 shows the measurement results. Note that in FIG. 13, the vertical axis represents normalized intensity when emission intensity in a state where carriers were steadily injected (when the pulse voltage was ON) was regarded as 1. The horizontal axis represents time elapsed after the falling of the pulse voltage.

The attenuation curve of the light-emitting element 3 of FIG. 13 was fitted with an exponential. As a result of the fitting, it was found that the proportion of delayed fluorescence from the light-emitting element 3 is higher than that of delayed fluorescence from the comparative light-emitting element 4. Thus, triplet-triplet annihilation (TTA) occurs more frequently in the light-emitting element 3 in which the host material of the light-emitting layer is CzPA having a T1 level lower than that of 1,6mMemFLPAPrn as the guest material (fluorescent dopant), than in the comparative light-emitting 4 in which the host material of the light-emitting layer is 35DCzPPy having a T1 level higher than that of 1,6mMemFLPAPrn.

<<Operation Characteristics of Light-Emitting Element 3 and Comparative Light-Emitting Element 4>>

Operation characteristics of the formed light-emitting element 3 and the comparative light-emitting element 4 were measured. It is to be noted that the measurement was performed at room temperature (in an atmosphere kept at 25° C.).

Table 6 below shows initial values of main characteristics of the light-emitting element 3 and the comparative light-emitting element 4 at a luminance of approximately 1000 cd/m$^2$.

and current efficiency. This is because the probability of occurrence of TTA can be increased by preventing a reduction of the probability of collision between triplet excitons due to localization of triplet excitons which are trapped by a guest material existing in only small amounts in a light-emitting layer.

REFERENCE NUMERALS

101: light-emitting layer,
102: host material,
103: guest material,
201: hole-transport layer,
202: light-emitting layer,
211: first electrode (anode),
212: second electrode (cathode),
213: hole-injection layer,
214: electron-transport layer,
215: electron-injection layer,
301: first electrode (anode),
302: second electrode (cathode),
303: EL layer,
304: hole-injection layer,
305: hole-transport layer,
306: light-emitting layer,
307: electron-transport layer,
308: electron-injection layer,
311: host material,
312: guest material,
313: hole-transport material,
401: first electrode,
402(1): first EL layer,
402(2): second EL layer,
402(n−1): (n−1)th EL layer,
402(n): nth EL layer,
404: second electrode,
405: charge generation layer (I),
405(1): first charge generation layer (I),
405(2): second charge generation layer (I),
405(n−2): (n−2)th charge generation layer (I),
405(n−1): (n−1)th charge generation layer (I),

TABLE 6

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting element 1 | 3.1 | 0.29 | 7.2 | (0.14, 0.20) | 1200 | 16 | 16 | 13 |
| Comparative light-emitting element 2 | 5.0 | 0.63 | 16.0 | (0.14, 0.20) | 1000 | 6.5 | 4.1 | 5.4 |

From the above results, it is found that the light-emitting element 3 formed in this example has higher current efficiency and higher external quantum efficiency than the comparative light-emitting element 4.

The results of the measurements of fluorescence lifetimes and operation characteristics of the light-emitting element 3 and the comparative light-emitting element 4 indicate that TTA is more likely to occur in the case where the T1 level of the guest material is higher than the T1 level of the host material, than the case where the T1 level of the guest material is lower than the T1 level of the host material. This high possibility leads to improved operation characteristics of a light-emitting element, e.g., external quantum efficiency

501: element substrate,
502: pixel portion,
503: driver circuit portion (source line driver circuit),
504a: driver circuit portion (gate line driver circuit),
504b: driver circuit portion (gate line driver circuit),
505: sealant,
506: sealing substrate,
507: wiring,
508: flexible printed circuit (FPC),
509: n-channel TFT,
510: p-channel TFT,
511: switching TFT,
512: current control TFT, 513: first electrode (anode),
514: insulator,
515: EL layer,
516: second electrode (cathode),
517: light-emitting element,
518: space,
900: substrate,
901: first electrode,
902: EL layer,
903: second electrode,
911: hole-injection layer,
912: hole-transport layer,
913: light-emitting layer,
914: electron-transport layer,
915: electron-injection layer,
7100: television device,
7101: housing,
7103: display portion,
7105: stand,
7107: display portion,
7109: operation key,
7110: remote controller,
7201: main body,
7202: housing,
7203: display portion,
7204: keyboard,
7205: external connection port,
7206: pointing device,
7302: housing,
7304: display panel,
7305: icon indicating time,
7306: another icon,
7311: operation button,
7312: operation button,
7313: connection terminal,
7321: band,
7322: clasp,
7400: mobile phone,
7401: housing,
7402: display portion,
7403: operation button,
7404: external connection port,
7405: speaker,
7406: microphone,
8001: lighting device,
8002: lighting device,
8003: lighting device,
8004: lighting device,
9033: clasp,
9034: display mode switch,
9035: power switch,
9036: power saver switch,
9038: operation switch,
9630: housing,
9631: display portion,
9631a: display portion,
9631b: display portion,
9632a: touch panel area,
9632b: touch panel area,
9633: solar battery,
9634: charge and discharge control circuit,
9635: battery,
9636: DCDC converter,
9637: operation key,
9638: converter,
9639: button This application is based on Japanese Patent Application serial no. 2013-104016 filed with Japan Patent Office on May 16, 2013, and Japanese Patent Application serial no. 2013-220059 filed with Japan Patent Office on Oct. 23, 2013, the entire contents of which are hereby incorporated by reference.

The invention claimed is:

1. A light-emitting element comprising:
a hole-transport layer having a uniform composition comprising a hole-transport material over a first electrode;
a hole injection layer between the first electrode and the hole-transport layer, the hole injection layer comprising the hole-transport material and an acceptor substance;
a light-emitting layer comprising a guest material and a host material over the hole-transport layer;
an electron-transport layer comprising an electron-transport material over and in contact with the light-emitting layer; and
a second electrode over the electron-transport layer,
wherein a lowest triplet exciton energy level (T1 level) of the host material is lower than a T1 level of the guest material,
wherein a T1 level of the hole-transport material is higher than the T1 level of the host material,
wherein at least one of the electron-transport material and the hole-transport material comprises a carbazole skeleton,
wherein the hole-transport layer abuts the light-emitting layer,
wherein a shape of a spectrum of delayed fluorescence of the light-emitting element coincides with a shape of an emission spectrum of the light-emitting element during steadily injecting carriers, and
wherein a peak of the spectrum of delayed fluorescence of the light-emitting element coincides with a peak of the emission spectrum of the light-emitting element.

2. The light-emitting element according to claim 1,
wherein a period where a ratio of an intensity of the delayed fluorescence with respect to an emission intensity during steadily injecting carriers is higher than or equal to 0.01 is $1 \times 10^{-6}$ sec or longer,
wherein the host material comprises a carbazole skeleton, and
wherein the guest material comprises a fluorescent material.

3. The light-emitting element according to claim 1,
wherein the host material comprises an anthracene compound, and
wherein the guest material comprises a pyrene compound.

4. A light-emitting device comprising:
the light-emitting element according to claim 1;
a first transistor; and
a second transistor,
wherein the first electrode of the light-emitting element is electrically connected to one of a source and a drain of the first transistor, and
wherein the first transistor comprises an oxide semiconductor in a channel formation region.

5. An electronic device comprising:
the light-emitting element according to claim 1;
a first transistor; and
a second transistor,
wherein the first electrode of the light-emitting element is electrically connected to one of a source and a drain of the first transistor, and
wherein an insulator is formed to cover end portions of the first electrode.

6. A light-emitting element comprising:
a hole-transport layer having a uniform composition comprising a hole-transport material over a first electrode;
a hole injection layer between the first electrode and the hole-transport layer, the hole injection layer comprising the hole-transport material and an acceptor substance;
a light-emitting layer comprising a guest material and a host material over the hole-transport layer;
an electron-transport layer comprising an electron-transport material over and in contact with the light-emitting layer; and
a second electrode over the electron-transport layer,
wherein a lowest triplet exciton energy level (T1 level) of the host material is lower than a T1 level of the guest material,
wherein a T1 level of the hole-transport material is higher than the T1 level of the host material,
wherein the host material and the electron-transport material comprise the same compound,
wherein at least one of the electron-transport material and the hole-transport material comprises a carbazole skeleton,
wherein the hole-transport layer abuts the light-emitting layer,
wherein a shape of a spectrum of delayed fluorescence of the light-emitting element coincides with a shape of an emission spectrum of the light-emitting element during steadily injecting carriers, and
wherein a peak of the spectrum of delayed fluorescence of the light-emitting element coincides with a peak of the emission spectrum of the light-emitting element.

7. The light-emitting element according to claim 6,
wherein a period where a ratio of an intensity of the delayed fluorescence with respect to an emission intensity during steadily injecting carriers is higher than or equal to 0.01 is $1 \times 10^{-6}$ sec or longer,
wherein the host material comprises a carbazole skeleton, and
wherein the guest material comprises a fluorescent material.

8. The light-emitting element according to claim 6,
wherein the host material comprises an anthracene compound, and
wherein the guest material comprises a pyrene compound.

9. A light-emitting device comprising:
the light-emitting element according to claim 6;
a first transistor; and
a second transistor,
wherein the first electrode of the light-emitting element is electrically connected to one of a source and a drain of the first transistor, and
wherein the first transistor comprises an oxide semiconductor in a channel formation region.

10. An electronic device comprising:
the light-emitting element according to claim 6;
a first transistor; and
a second transistor,
wherein the first electrode of the light-emitting element is electrically connected to one of a source and a drain of the first transistor, and
wherein an insulator is formed to cover end portions of the first electrode.

11. A light-emitting element comprising:
a hole-transport layer having a uniform composition comprising a hole-transport material over a first electrode;
a hole injection layer between the first electrode and the hole-transport layer, the hole injection layer comprising the hole-transport material and an acceptor substance;
a light-emitting layer comprising a guest material and a host material over the hole-transport layer;
an electron-transport layer comprising an electron-transport material over and in contact with the light-emitting layer; and
a second electrode over the electron-transport layer,
wherein a lowest triplet exciton energy level (T1 level) of the host material is lower than a T1 level of the guest material,
wherein a T1 level of the hole-transport material is higher than the T1 level of the host material,
wherein a shape of a spectrum of delayed fluorescence of the light-emitting element coincides with a shape of an emission spectrum of the light-emitting element during steadily injecting carriers,
wherein a peak of the spectrum of delayed fluorescence of the light-emitting element coincides with a peak of the emission spectrum of the light-emitting element,
wherein a period where a ratio of an intensity of the delayed fluorescence with respect to an emission intensity during steadily injecting carriers is higher than or equal to 0.01 is $1 \times 10^{-6}$ sec or longer,
wherein the hole-transport material comprises a phenanthrene compound comprising a carbazolyl group, and
wherein the electron-transport material comprises a phenanthroline compound.

12. The light-emitting element according to claim 11,
wherein the host material comprises a carbazole skeleton, and
wherein the guest material comprises a fluorescent material.

13. The light-emitting element according to claim 11,
wherein the host material comprises an anthracene compound, and
wherein the guest material comprises a pyrene compound.

14. A light-emitting device comprising:
the light-emitting element according to claim 11;
a first transistor; and
a second transistor,
wherein the first electrode of the light-emitting element is electrically connected to one of a source and a drain of the first transistor, and
wherein the first transistor comprises an oxide semiconductor in a channel formation region.

15. An electronic device comprising:
the light-emitting element according to claim 11;
a first transistor; and
a second transistor,
wherein the first electrode of the light-emitting element is electrically connected to one of a source and a drain of the first transistor, and
wherein an insulator is formed to cover end portions of the first electrode.

* * * * *